(12) United States Patent
Shao et al.

(10) Patent No.: US 12,446,212 B2
(45) Date of Patent: Oct. 14, 2025

(54) SEMICONDUCTOR STRUCTURE, METHOD FOR MANUFACTURING SAME AND MEMORY

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN); Yi Jiang, Hefei (CN); Xingsong Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 420 days.

(21) Appl. No.: 18/171,284

(22) Filed: Feb. 17, 2023

(65) Prior Publication Data

US 2024/0049453 A1 Feb. 8, 2024

(30) Foreign Application Priority Data

Aug. 5, 2022 (CN) .......................... 202210939226.2

(51) Int. Cl.
*H10B 12/00* (2023.01)

(52) U.S. Cl.
CPC .......... *H10B 12/482* (2023.02); *H10B 12/02* (2023.02); *H10B 12/488* (2023.02)

(58) Field of Classification Search
CPC .... H10B 12/482; H10B 12/02; H10B 12/488; H10B 12/053
See application file for complete search history.

(56) References Cited

U.S. PATENT DOCUMENTS

2024/0292606 A1* 8/2024 Hua ..................... H10B 12/053

FOREIGN PATENT DOCUMENTS

CN 103531479 A 1/2014

* cited by examiner

*Primary Examiner* — Mohammed R Alam
(74) *Attorney, Agent, or Firm* — SYNCODA LLC; Feng Ma

(57) ABSTRACT

A method for manufacturing a semiconductor structure includes providing a substrate; forming mutually parallel first trenches extending along a first direction in the substrate and first isolation structures filling the first trenches; forming mutually parallel second trenches extending along a second direction in the substrate and in the first isolation structures, the first and second trenches dividing the substrate to form active pillars, and a depth of the second trenches being less than that of the first trenches; forming second isolation structures alternately arranged with the first isolation structures along the second direction at bottoms of the second trenches, top surfaces of the second isolation structures being lower than bottom surfaces of the second trenches located in the first isolation structures; forming bit line structures on the second isolation structures; and forming word line structures above the bit line structures.

18 Claims, 16 Drawing Sheets

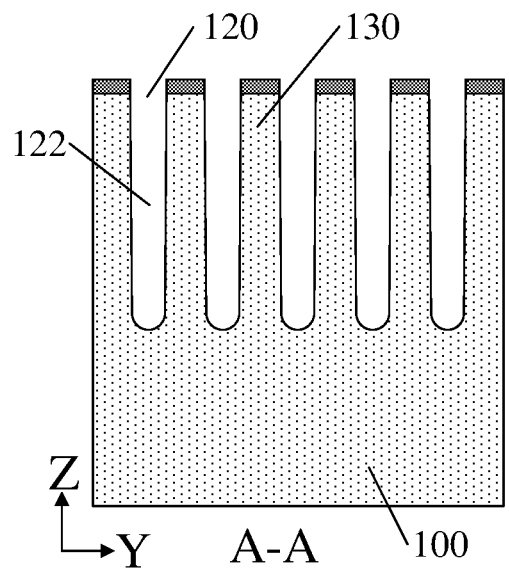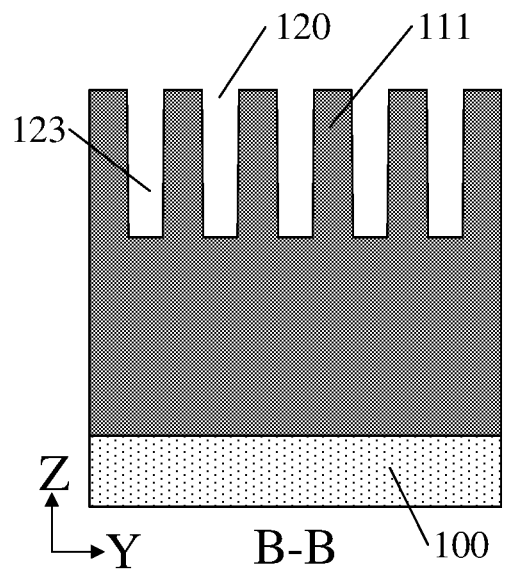
FIG. 4A  FIG. 4B
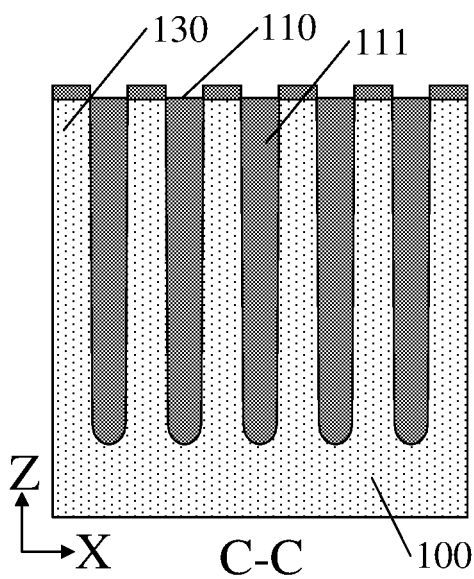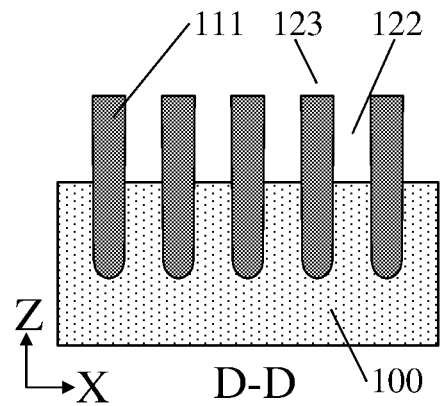
FIG. 4C  FIG. 4D

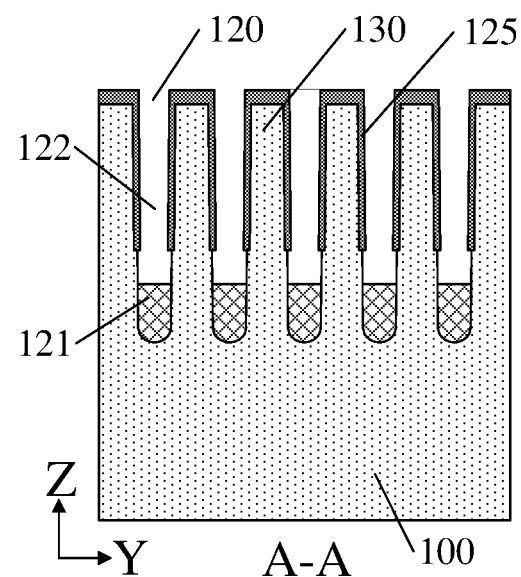
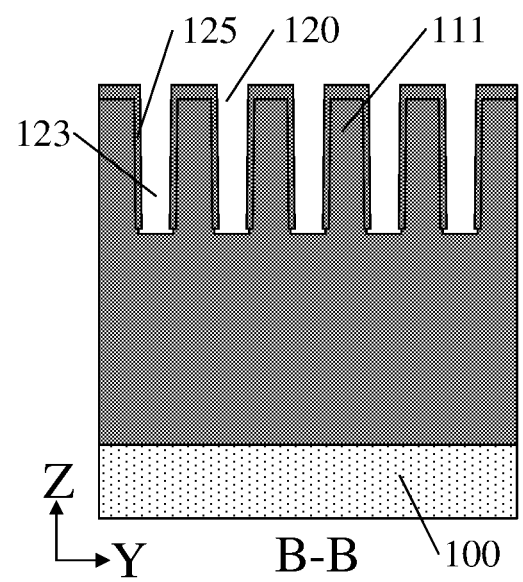
FIG. 7A　　　　　　　　　　FIG. 7B
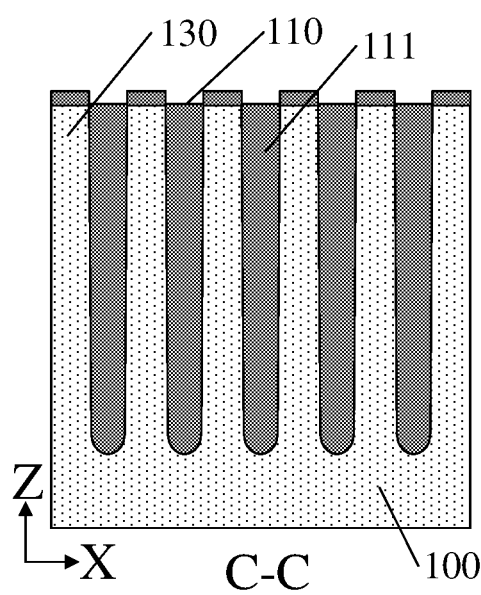
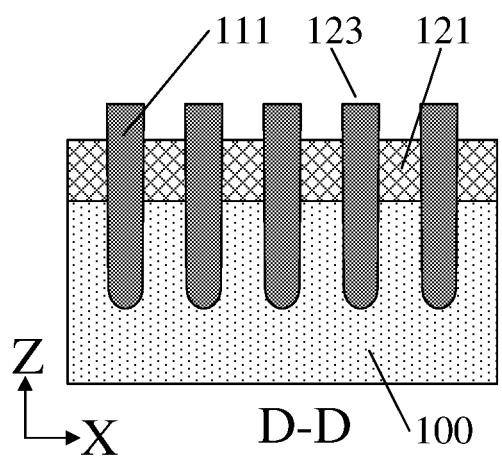
FIG. 7C　　　　　　　　　　FIG. 7D

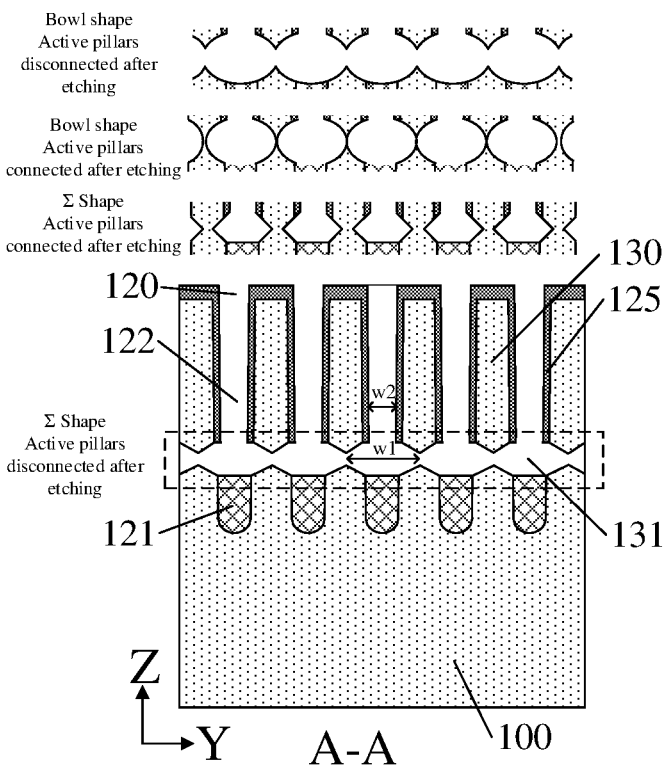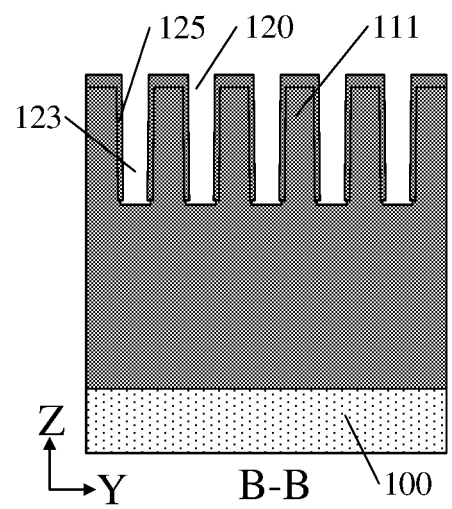
FIG. 8A  FIG. 8B
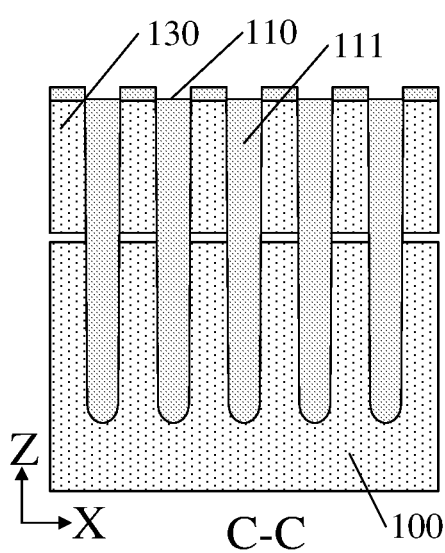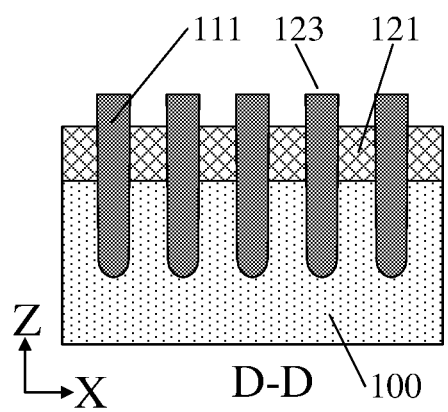
FIG. 8C  FIG. 8D

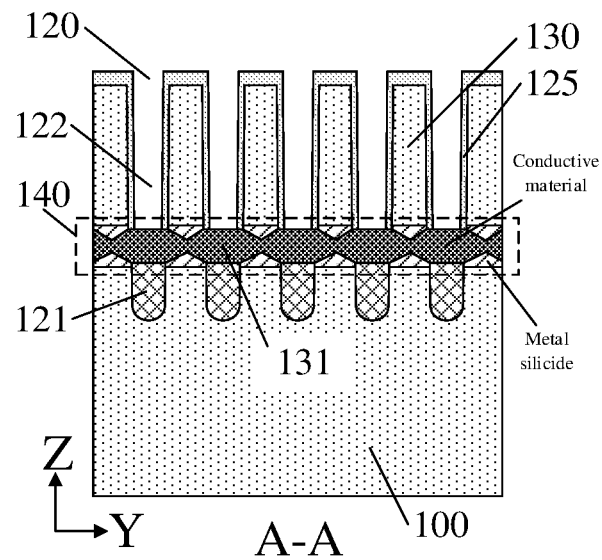
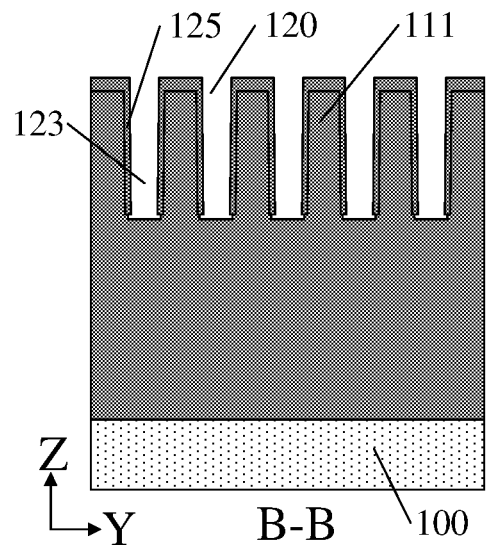
FIG. 9A
FIG. 9B
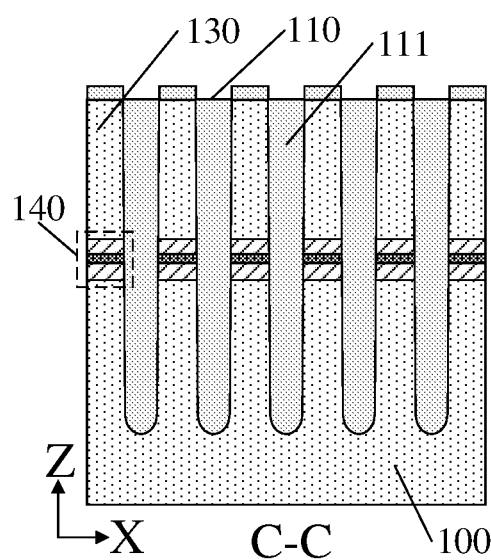
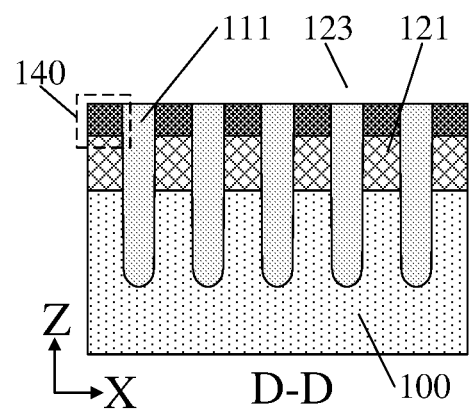
FIG. 9C
FIG. 9D

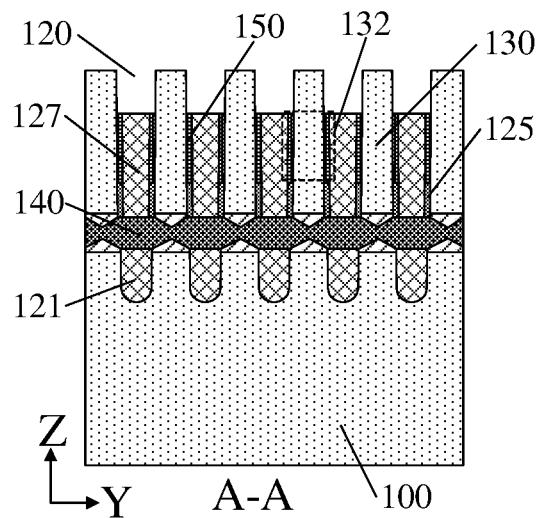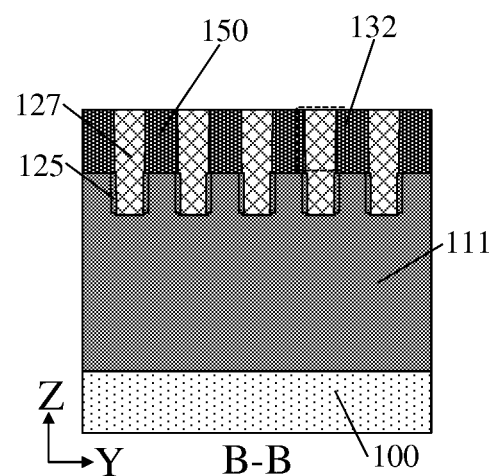
FIG. 12A  FIG. 12B
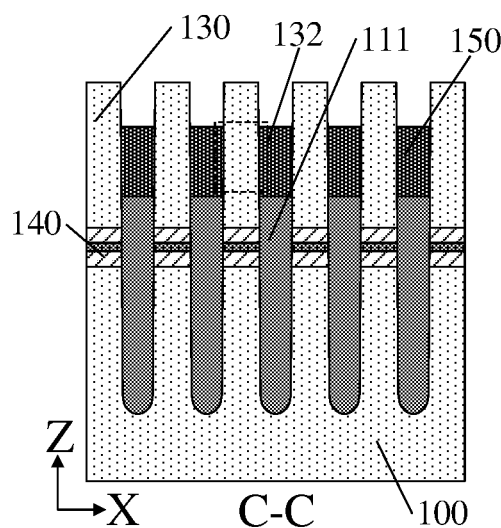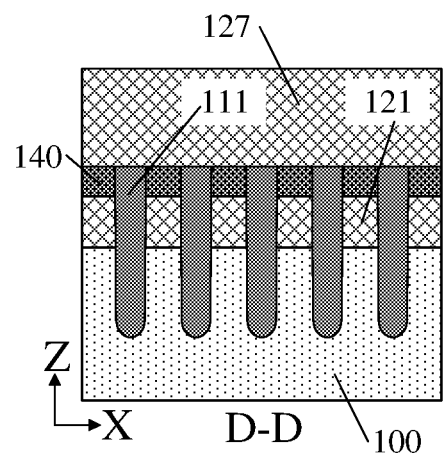
FIG. 12C  FIG. 12D

SEMICONDUCTOR STRUCTURE, METHOD FOR MANUFACTURING SAME AND MEMORY

CROSS-REFERENCE TO RELATED APPLICATION

This application claims priority to Chinese Patent Application No. 202210939226.2 filed on Aug. 5, 2022, the disclosure of which is hereby incorporated by reference in its entirety.

BACKGROUND

With a continuous development of science and technology, semiconductor devices are widely used in various electronic equipment and electronic products. Random access memory (RAM), as a kind of volatile memory, is a semiconductor memory device commonly used in computers.

In order to improve the memory capacity, semiconductor devices are required to have a higher integration density and a smaller feature dimension. In recent years, the memory structure has developed from planar gate to Gate-All-Around (GAA). The GAA achieves all around wrapping of the channel by the gate, and improves performance and density of the memory. However, with a development of semiconductor manufacturing process, distances between adjacent conductive structures in a memory with GAA are decreasing, which is prone to current leakage and other problems.

SUMMARY

The disclosure relates to the technical field of semiconductors, and relates to but is not limited to a semiconductor structure, a method for manufacturing the same and a memory.

In view of this, embodiments of the disclosure provide a semiconductor structure, a method for manufacturing the same and a memory.

In the first aspect, embodiments of the disclosure provide a method for manufacturing a semiconductor structure, and the method includes the following operations.

A substrate is provided. A plurality of mutually parallel first trenches extending along a first direction and first isolation structures filling the first trenches are formed in the substrate. The first direction is parallel to a surface of the substrate. A plurality of mutually parallel second trenches extending along a second direction in the substrate and in the first isolation structures is formed. The first trenches and the second trenches divide the substrate to form a plurality of active pillars, the second direction is parallel to the surface of the substrate and perpendicular to the first direction, and a depth of the second trenches is less than a depth of the first trenches. Second isolation structures alternately arranged with the first isolation structures along the second direction are formed at bottoms of the second trenches. Top surfaces of the second isolation structures are lower than bottom surfaces of the second trenches located in the first isolation structures. A plurality of mutually parallel bit line structures extending along the first direction are formed above the second isolation structures. Each of the bit line structures penetrates a plurality of active pillars along the first direction. A plurality of mutually parallel word line structures extending along the second direction are formed above the bit line structures.

In the second aspect, embodiments of the disclosure provide a semiconductor structure The semiconductor structure includes: a substrate; a plurality of mutually parallel first trenches located in the substrate and extending along a first direction and first isolation structures located in the first trenches, wherein the first direction is parallel to a surface of the substrate; a plurality of mutually parallel second trenches extending along a second direction located in the substrate, wherein the first trenches and the second trenches divide the substrate into a plurality of active pillars, the second direction is parallel to the surface of the substrate and perpendicular to the first direction, and a depth of the second trenches is less than a depth of the first trenches; second isolation structures located at bottoms of the second trenches and alternately arranged with the first isolation structures along the second direction, wherein top surfaces of the second isolation structures are lower than bottom surfaces of the second trenches located in the first isolation structures; a plurality of mutually parallel bit line structures located above the second isolation structures and extending along the first direction, wherein each of the bit line structures penetrates the plurality of active pillars along the first direction; and a plurality of mutually parallel word line structures located above the bit line structures and extending along the second direction.

In the third aspect, the embodiments of the disclosure provide a memory, including: a semiconductor structure according to any one of the above embodiments; storage nodes, located on the surface of the substrate and each connected to the top active area of each of the active pillars.

BRIEF DESCRIPTION OF THE DRAWINGS

FIG. 4A shows a first cross-sectional schematic diagram of forming second trenches provided by an embodiment of the disclosure.

FIG. 4B shows a second cross-sectional schematic diagram of forming second trenches provided by an embodiment of the disclosure.

FIG. 4C shows a third cross-sectional schematic diagram of forming second trenches provided by an embodiment of the disclosure.

FIG. 4D shows a fourth cross-sectional schematic diagram of forming second trenches provided by an embodiment of the disclosure.

FIG. 7A shows a first cross-sectional schematic diagram of forming second isolation structures provided by an embodiment of the disclosure.

FIG. 7B shows a second cross-sectional schematic diagram of forming second isolation structures provided by an embodiment of the disclosure.

FIG. 7C shows a third cross-sectional schematic diagram of forming second isolation structures provided by an embodiment of the disclosure.

FIG. 7D shows a fourth cross-sectional schematic diagram of forming second isolation structures provided by an embodiment of the disclosure.

FIG. 8A shows a first cross-sectional schematic diagram of forming recesses provided by an embodiment of the disclosure.

FIG. 8B shows a second cross-sectional schematic diagram of forming recesses provided by an embodiment of the disclosure.

FIG. 8C shows a third cross-sectional schematic diagram of forming recesses provided by an embodiment of the disclosure.

FIG. 8D shows a fourth cross-sectional schematic diagram of forming recesses provided by an embodiment of the disclosure.

FIG. 9A shows a first cross-sectional schematic diagram of forming bit line structures provided by an embodiment of the disclosure.

FIG. 9B shows a second cross-sectional schematic diagram of forming bit line structures provided by an embodiment of the disclosure.

FIG. 9C shows a third cross-sectional schematic diagram of forming bit line structures provided by an embodiment of the disclosure.

FIG. 9D shows a fourth cross-sectional schematic diagram of forming bit line structures provided by an embodiment of the disclosure.

FIG. 12A shows a first cross-sectional schematic diagram of forming word line structures provided by an embodiment of the disclosure.

FIG. 12B shows a second cross-sectional schematic diagram of forming word line structures provided by an embodiment of the disclosure.

FIG. 12C shows a third cross-sectional schematic diagram of forming word line structures provided by an embodiment of the disclosure.

FIG. 12D shows a fourth cross-sectional schematic diagram of forming word line structures provided by an embodiment of the disclosure.

DETAILED DESCRIPTION

Figure 1A:
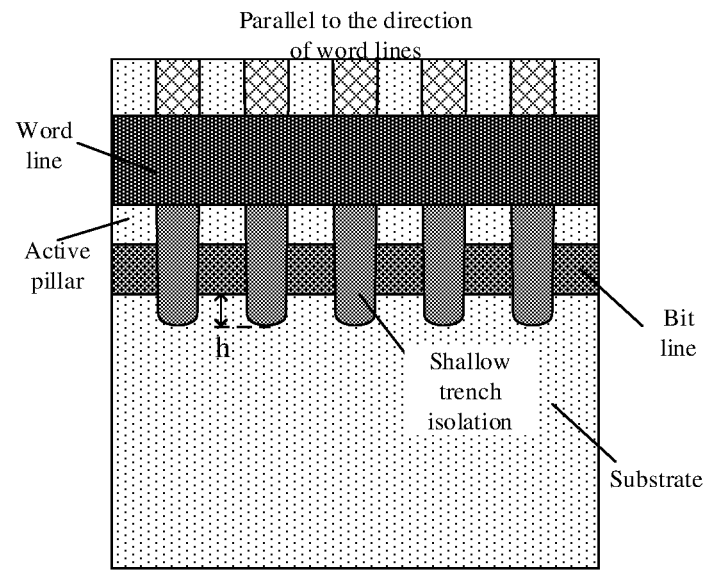
FIG. 1A is a first schematic diagram of a semiconductor structure provided by an embodiment of the disclosure.

In order to facilitate understanding of the disclosure, exemplary embodiments of the disclosure will be described in more detail below with reference to the related accompanying drawings. Although the exemplary embodiments of the disclosure are shown in the accompanying drawings, it should be understood that the disclosure may be implemented in various forms, and should not be limited by the specific embodiments set forth herein. On the contrary, these embodiments are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In some embodiments, some technical features well known in the art are not described in order to avoid confusion with the disclosure, that is, all features of the actual embodiments may not be described herein and well-known functions and structures are not described in detail.

Generally, terms can be understood, at least in part, from their use in context. For example, depending at least in part on the context, the term "one or more" as used herein may be used to describe any feature, structure, or characteristic in a singular sense, or may be used to describe a combination of features, structures, or characteristics in a plural sense. Similarly, terms such as "a" or "said" may likewise be understood as conveying singular usage or conveying plural usage, depending at least in part on the context. Additionally, the term "based on" may be understood as not necessarily intended to convey an exclusive set of factors, and may alternatively allow an existence of additional factors that are not necessarily explicitly described, also depending at least in part on context.

Terms used herein are intended to describe specific embodiments only and is not to be a limitation of the disclosure unless otherwise defined. As used herein, the singular forms of "a", "an" and "said/the" are also intended to include the plural forms, unless the context clearly indicates otherwise. It should also be understood that the terms "compose" and/or "include", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

In order to fully understand the disclosure, detailed operations and detailed structures are presented in the following description in order to explain the technical solution of the disclosure. Preferred embodiments of the disclosure are described in detail below. However, the disclosure may have other embodiments except these detailed descriptions.

Figure 1B:
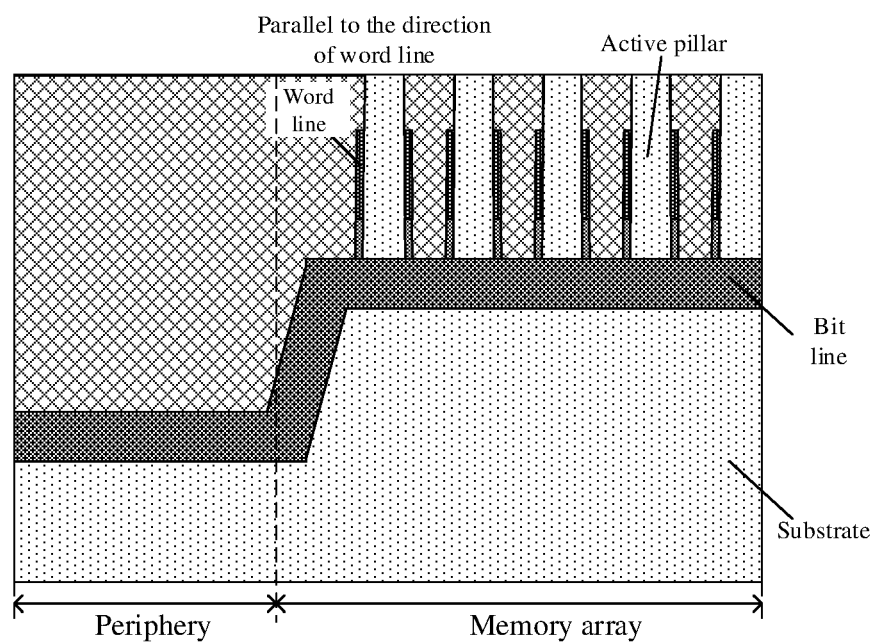
FIG. 1B is a second schematic diagram of a semiconductor structure provided by an embodiment of the disclosure.
Figure 1C:
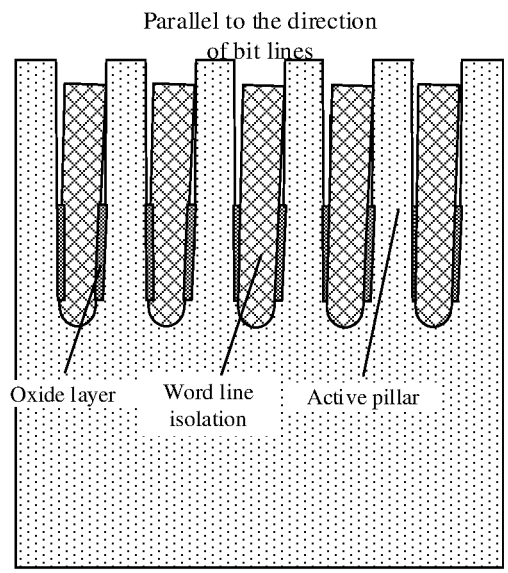
FIG. 1C is a third schematic diagram of a semiconductor structure provided by an embodiment of the disclosure.

In some embodiments, the semiconductor structure adopts buried bit lines. The bit lines are located at bottoms of active pillars and close to the lowermost ends of shallow trench isolations (STI). Word lines are above the bit lines. As shown in FIG. 1A, because a height difference h between the bottom of the bit line and the lowermost end of the shallow trench isolation is smaller, current leakage phenomenon is easy to occur between two adjacent bit lines. As shown in FIG. 1B, a silicon substrate located in a periphery region near an edge of a memory array is prone to be over etched, which leads to more consumption of the silicon substrate and a smaller depth of the shallow trench isolations between the bit lines and the peripheral circuit, thus current leakage between the bit lines at the edge of the memory array and the periphery is likely to occur. As shown in FIG. 1C, in an actual process, the trenches are wide at the tops and narrow at the bottoms, so word line isolations formed in the trenches and located above a bit line are of an inverted cone shape. After removing oxide spacers on sidewalls of the trenches, the word line isolations are prone to skew or even collapse, which affects subsequent processes of filling a conductive material to form word lines.

Figure 2:
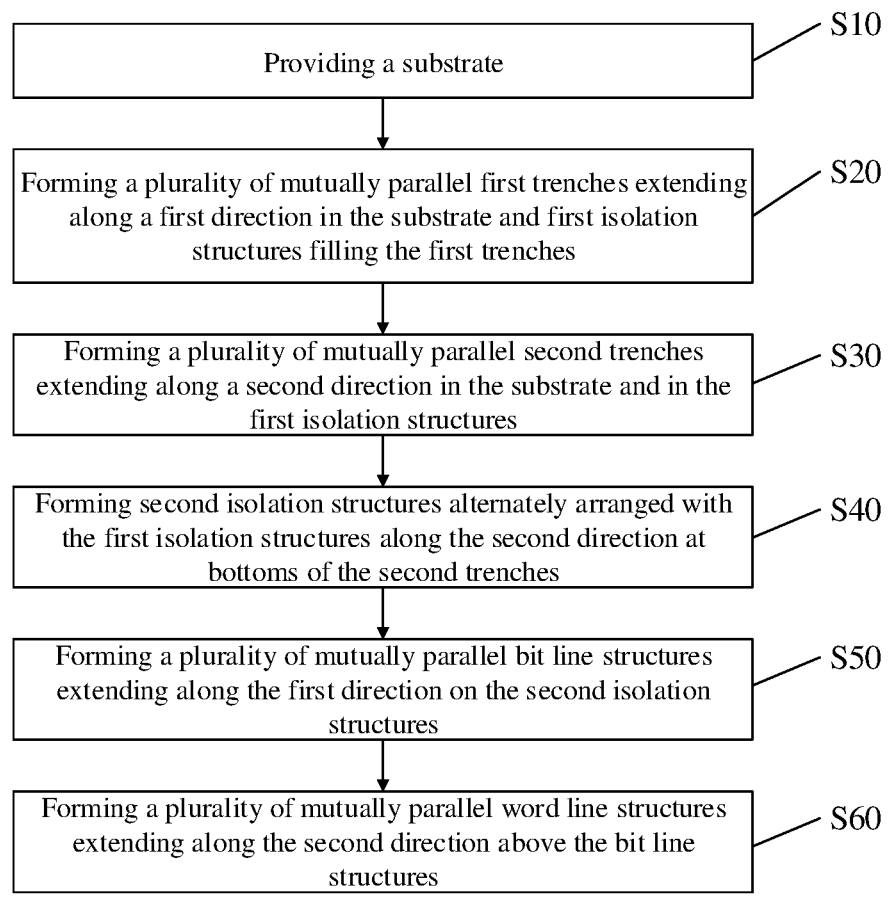
FIG. 2 is a flowchart of a method for manufacturing a semiconductor structure provided by an embodiment of the disclosure.
Figure 3A:
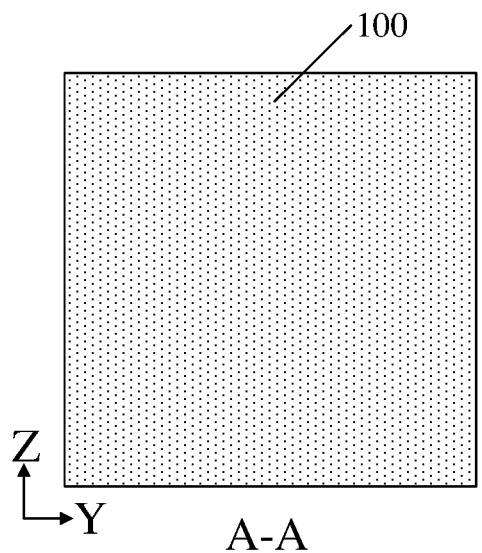
FIG. 3A shows a first cross-sectional schematic diagram of forming first isolation structures provided by an embodiment of the disclosure.
Figure 3B:
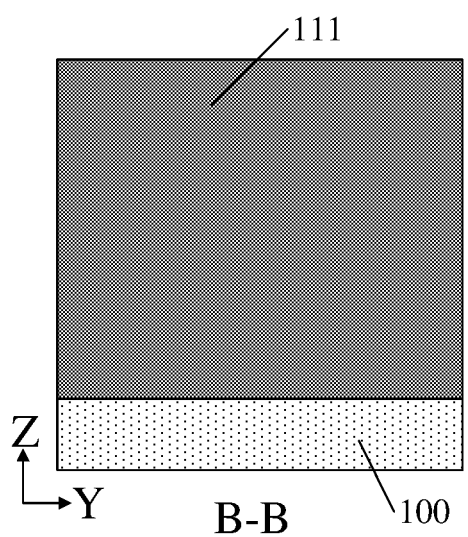
FIG. 3B shows a second cross-sectional schematic diagram of forming first isolation structures provided by an embodiment of the disclosure.
Figure 3C:
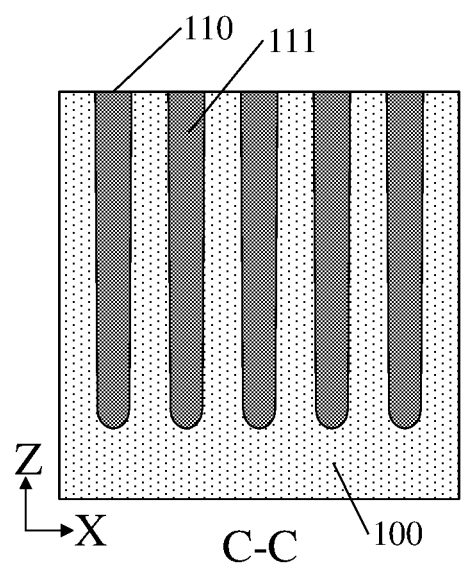
FIG. 3C shows a third cross-sectional schematic diagram of forming first isolation structures provided by an embodiment of the disclosure.
Figure 3D:
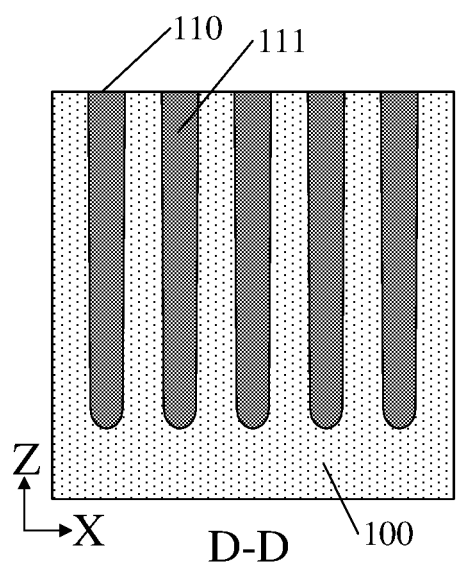
FIG. 3D shows a fourth cross-sectional schematic diagram of forming first isolation structures provided by an embodiment of the disclosure.
Figure 5A:
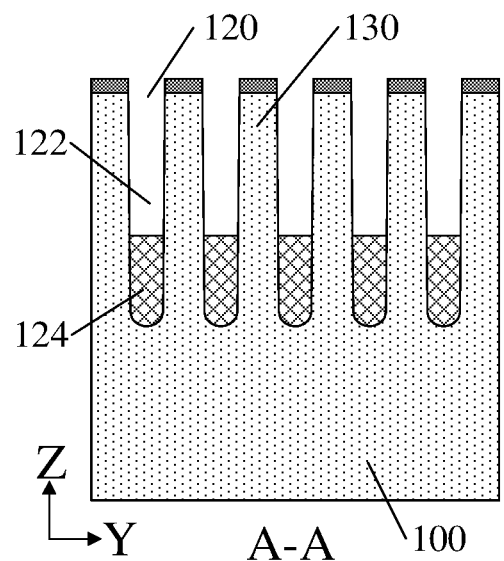
FIG. 5A shows a first cross-sectional schematic diagram of forming initial second isolation structures provided by an embodiment of the disclosure.
Figure 5B:
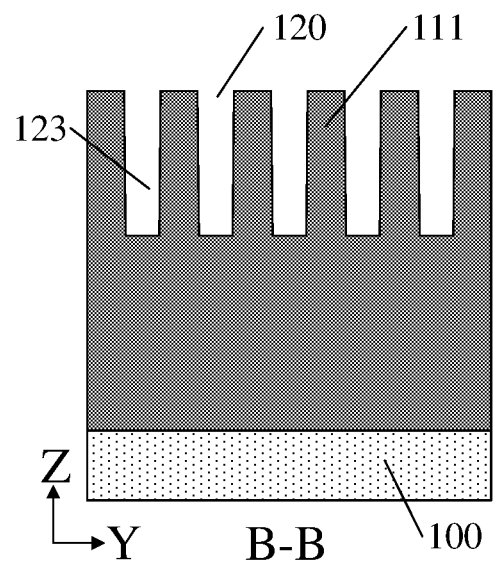
FIG. 5B shows a second cross-sectional schematic diagram of forming initial second isolation structures provided by an embodiment of the disclosure.
Figure 5C:
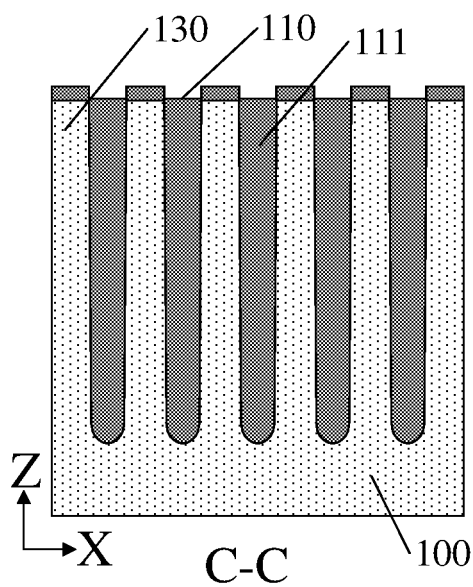
FIG. 5C shows a third cross-sectional schematic diagram of forming initial second isolation structures provided by an embodiment of the disclosure.
Figure 5D:
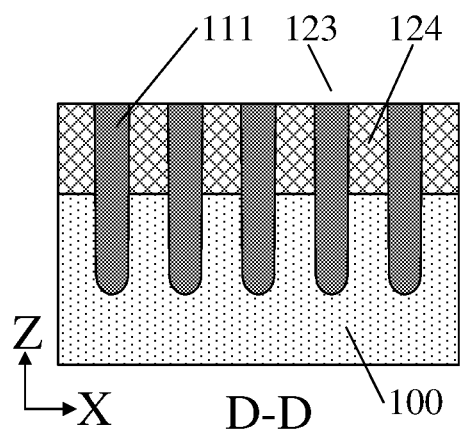
FIG. 5D shows a fourth cross-sectional schematic diagram of forming initial second isolation structures provided by an embodiment of the disclosure.
Figure 6A:
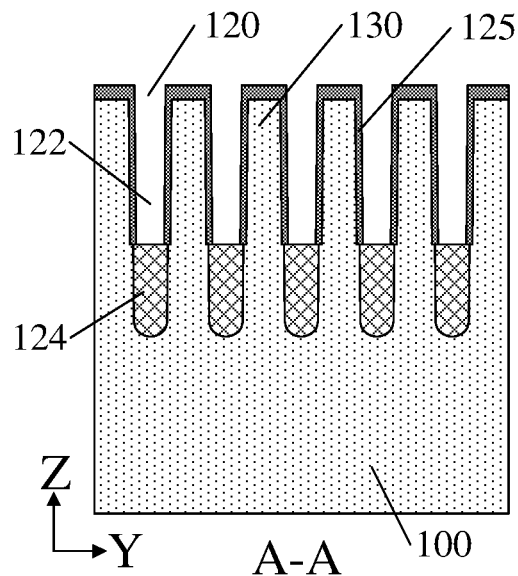
FIG. 6A shows a first cross-sectional schematic diagram of forming protective layers provided by an embodiment of the disclosure.
Figure 6B:
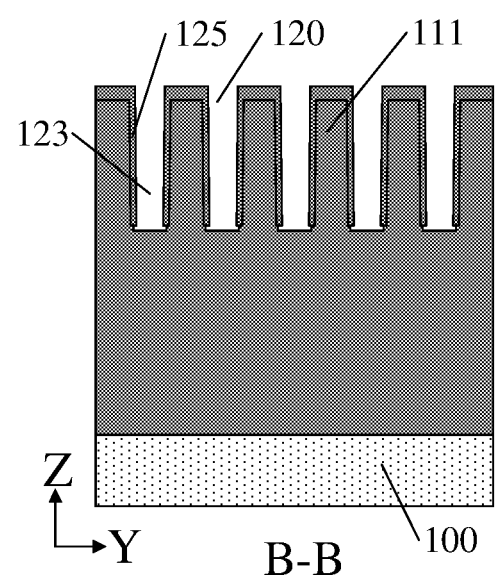
FIG. 6B shows a second cross-sectional schematic diagram of forming protective layers provided by an embodiment of the disclosure.
Figure 6C:
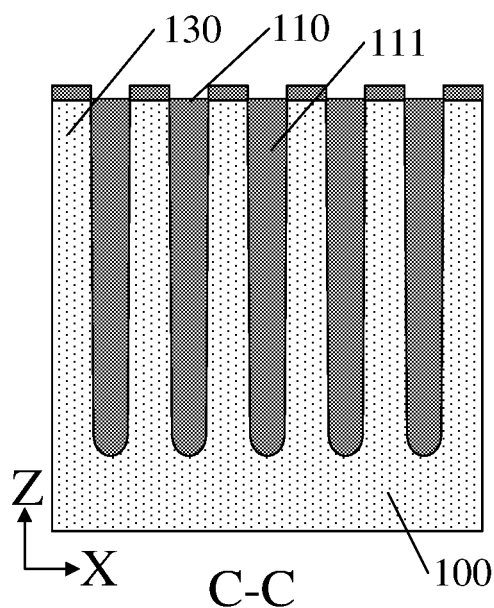
FIG. 6C shows a third cross-sectional schematic diagram of forming protective layers provided by an embodiment of the disclosure.
Figure 6D:
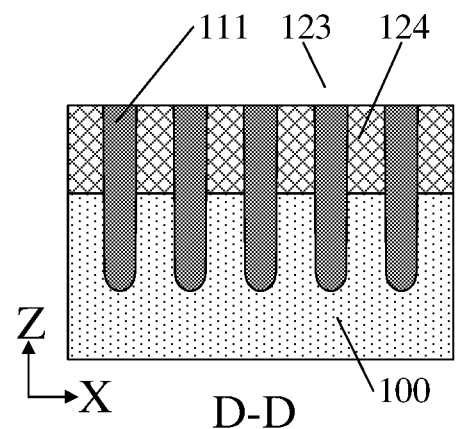
FIG. 6D shows a fourth cross-sectional schematic diagram of forming protective layers provided by an embodiment of the disclosure.
Figure 10A:
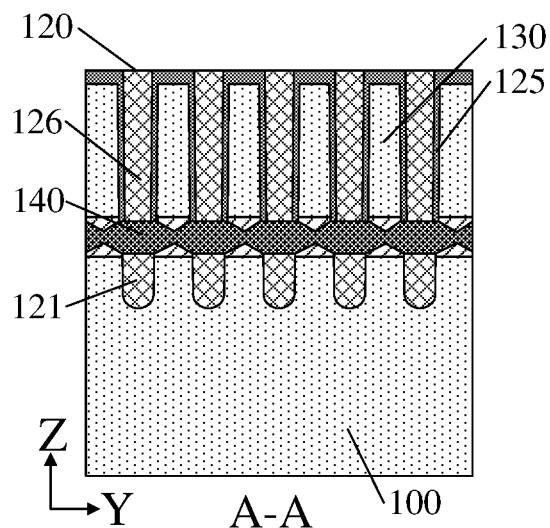
FIG. 10A shows a first cross-sectional schematic diagram of forming initial third isolation structures provided by an embodiment of the disclosure.
Figure 10B:
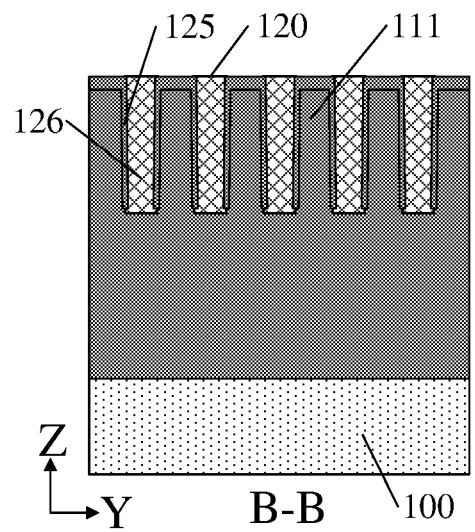
FIG. 10B shows a second cross-sectional schematic diagram of forming initial third isolation structures provided by an embodiment of the disclosure.
Figure 10C:
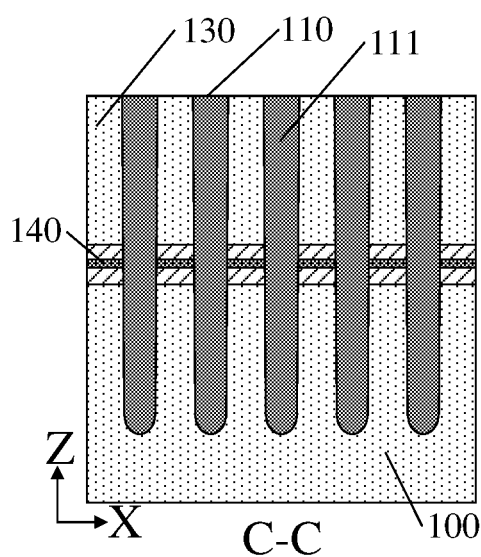
FIG. 10C shows a third cross-sectional schematic diagram of forming initial third isolation structures provided by an embodiment of the disclosure.
Figure 10D:
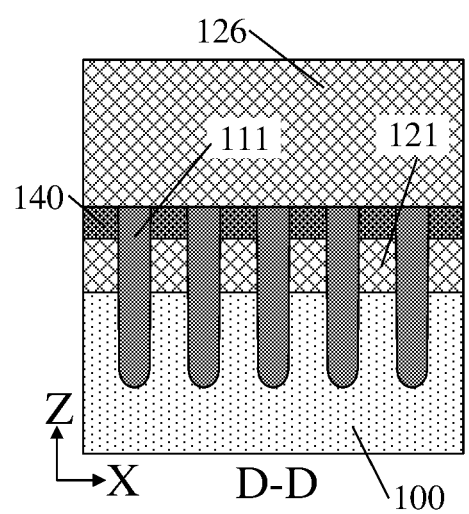
FIG. 10D shows a fourth cross-sectional schematic diagram of forming initial third isolation structures provided by an embodiment of the disclosure.
Figure 11A:
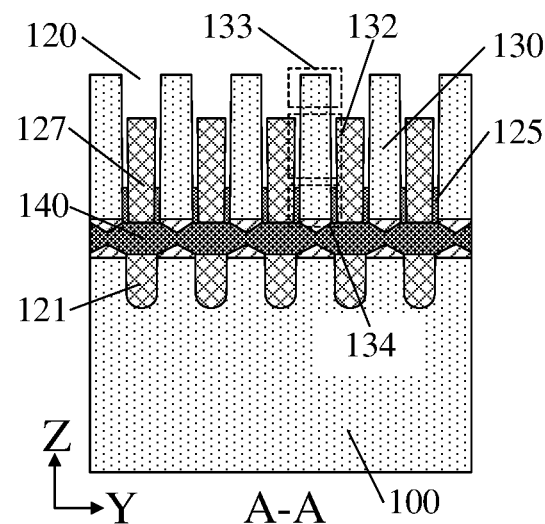
FIG. 11A shows a first cross-sectional schematic diagram of forming third isolation structures provided by an embodiment of the disclosure.
Figure 11B:
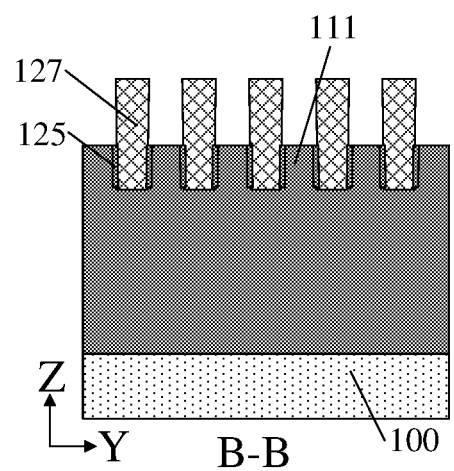
FIG. 11B shows a second cross-sectional schematic diagram of forming third isolation structures provided by an embodiment of the disclosure.
Figure 11C:
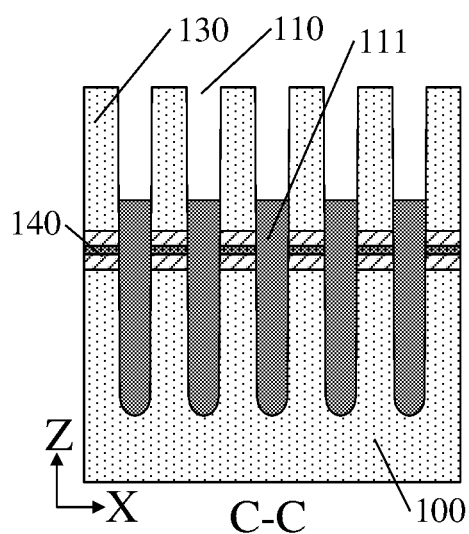
FIG. 11C shows a third cross-sectional schematic diagram of forming third isolation structures provided by an embodiment of the disclosure.
Figure 11D:
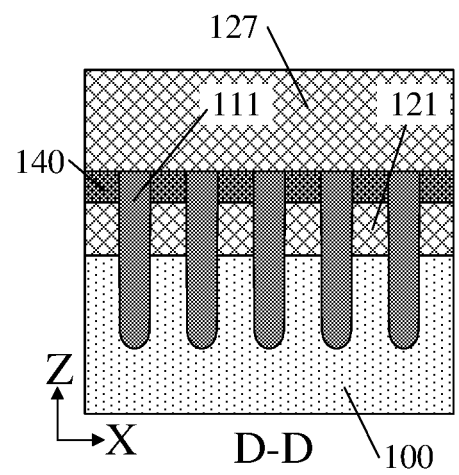
FIG. 11D shows a fourth cross-sectional schematic diagram of forming third isolation structures provided by an embodiment of the disclosure.
Figure 13A:
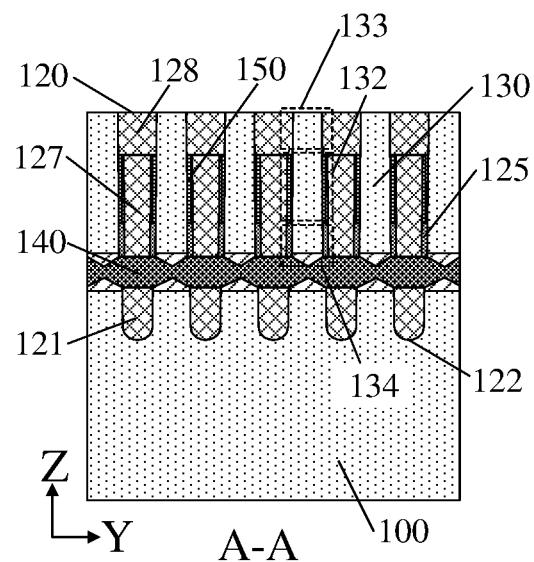
FIG. 13A shows a first cross-sectional schematic diagram of forming fourth isolation structures provided by an embodiment of the disclosure.
Figure 13B:
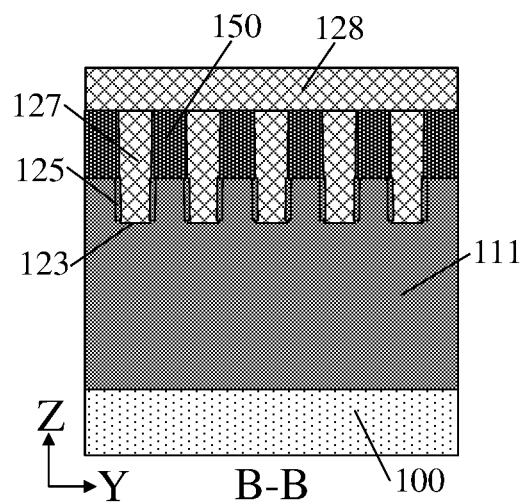
FIG. 13B shows a second cross-sectional schematic diagram of forming fourth isolation structures provided by an embodiment of the disclosure.
Figure 13C:
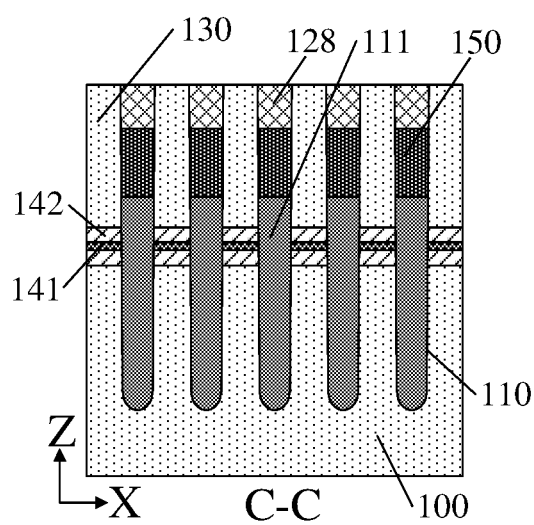
FIG. 13C shows a third cross-sectional schematic diagram of forming fourth isolation structures provided by an embodiment of the disclosure.
Figure 13D:
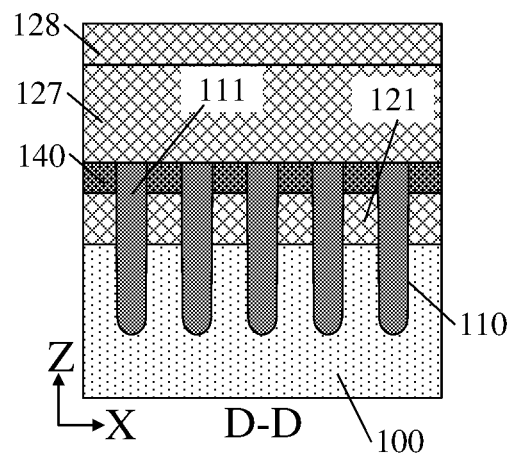
FIG. 13D shows a fourth cross-sectional schematic diagram of forming fourth isolation structures provided by an embodiment of the disclosure.

As shown in FIG. 2, a method for manufacturing a semiconductor structure provided by an embodiment of the disclosure includes the following operations.

In S10, a substrate is provided.

In S20, a plurality of mutually parallel first trenches extending along a first direction and first isolation structures filling the first trenches are formed in the substrate. The first direction is parallel to a surface of the substrate.

In S30, a plurality of mutually parallel second trenches extending along a second direction are formed in the substrate and in the first isolation structures. The first trenches and the second trenches divide the substrate to form a plurality of active pillars. The second direction is parallel to the surface of the substrate and perpendicular to the first direction. A depth of the second trenches is less than a depth of the first trenches.

In S40, second isolation structures alternately arranged with the first isolation structures along the second direction are formed at bottoms of the second trenches. Top surfaces of the second isolation structures are lower than bottom surfaces of the second trenches located at the first isolation structures.

In S50, a plurality of mutually parallel bit line structures extending along the first direction are formed above the second isolation structures. Each of the bit line structures penetrates a plurality of active pillars along the first direction.

In S60, a plurality of mutually parallel word line structures extending along the second direction are formed above the bit line structures.

It is to be understood that the operations shown in FIG. 2 are not exclusive and that other operations may be performed before, after, or between any of the operations. The sequence of the operations shown in FIG. 2 can be adjusted according to actual needs.

Here and hereafter the first direction and the second direction are represented as two directions parallel to the surface of the substrate. In some embodiments, an included angle between the first direction and the second direction ranges from 0 to 90 degrees. In some specific embodiments, the first direction may be perpendicular to the second direction. It is to be understood that, positions and an arrangement of the multiple active pillars are determined by an included angle between the first direction and the second direction. In order to clearly describe the disclosure, the following embodiments will be described by taking the following directions as an example: the first direction as a Y direction in the accompany drawings, the second direction as an X direction in the accompany drawings, and a thickness direction of the substrate as a Z direction. However, it should be noted that the following description of the directions by the embodiments is only to illustrate the present disclosure and is not intended to limit the scope of the present disclosure.

Figure 14:
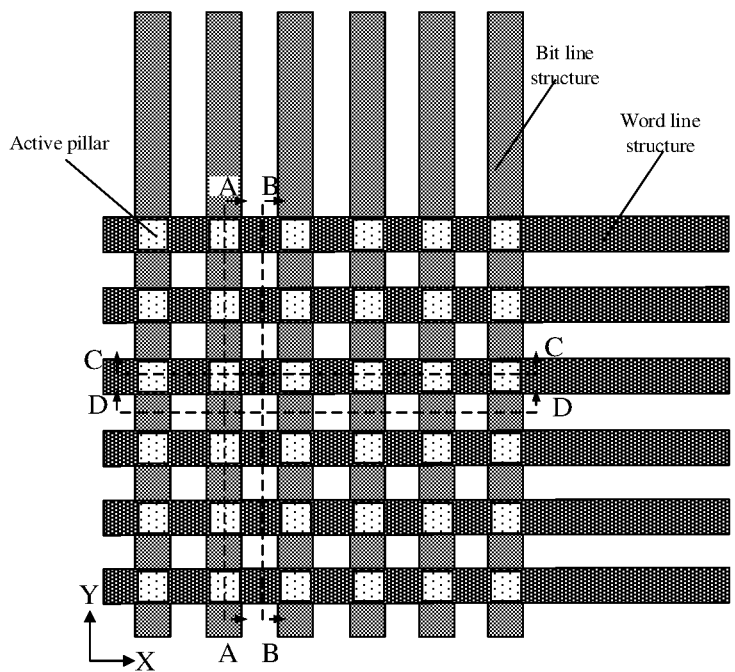
FIG. 14 is a top view schematic diagram of a semiconductor structure provided by an embodiment of the disclosure.

FIGS. 3A to 13D are cross-sectional schematic diagrams of a semiconductor structure in a manufacturing process provided by an embodiment of the disclosure. FIG. 14 is a schematic diagram of a semiconductor structure in an XY plane according to an embodiment of the disclosure. It is worth noting that FIG. 14 does not represent an actual semiconductor structure of any of the manufacturing processes of the disclosure and only serves as a schematic diagram in a top view direction for the sake of understanding of FIGS. 3A to 13D by those skilled in the art. Taking FIG. 3A to FIG. 3D as an example, FIG. 3A to FIG. 3D show cross-sectional schematic diagrams in cross-sectional directions A-A, B-B, C-C and D-D in FIG. 14, respectively. That is, the accompany drawings having the same number represent cross-sectional schematic diagrams along the cross-sectional directions in FIG. 14 of the same manufacturing process. FIGS. 4A to 13D can be understood with reference to the above illustration and will not be repeated below.

It should be understood that in order for each structure to be clearly shown in the accompany drawings, dimensional proportions of each structure may be inconsistent with the actual structures.

In the embodiments of the disclosure, the semiconductor structure may be used for a memory. The memory includes, but is not limited to, dynamic random access memory (DRAM), static random access memory (SRAM), ferroelectric random access memory (FRAM), magnetic random access memory (MRAM), phase change random access memory (PCRAM), resistive random access memory (RRAM), nano random access memory (NRAM), etc.

S10 is performed. A material of the substrate 100 may include an elemental semiconductor material such as silicon (Si), germanium (Ge), or the like, or a compound semiconductor material such as gallium nitride (GaN), gallium arsenide (GaAs), indium phosphide (InP), or the like. The substrate 100 may also be doped, or include doped regions and un-doped regions in the substrate. In some embodiments, the substrate 100 may include a memory array region and a periphery region, and various structures and devices in both may be formed synchronously.

S20 is performed. As shown in FIGS. 3A to 3D, multiple mutually parallel first trenches 110 extending in the Y direction may be formed from the surface of the substrate 100 by a process such as photolithography, etching or the like. For example, a mask corresponding to the first trenches 110 may be formed on the surface of the substrate 100 by a photolithography process, and then the substrate 100 may be etched through the mask by an etching process, thereby forming the first trenches 110. By a process such as deposition, the first trenches 110 may then be filled with a first isolation material, including but not limited to silicon oxide (SiO$_2$), spin-on dielectrics (SOD), silicon nitride (Si$_3$N$_4$), silicon oxynitride (SiON), and so on, to form first isolation structures 111. Each of the first isolation structures 111 may be used to isolate two adjacent ones of bit line structures that are subsequently formed. The etching process here may be classified to dry etching and wet etching. The dry etching may include ion beam milling etching, plasma etching, reactive ion etching, laser ablation, and so on. The wet etching refers to use a solvent or solution, such as an acid or base solution, for etching. A deposition process includes, but is not limited to, chemical vapor deposition (CVD), atomic layer deposition (ALD), physical vapor deposition (PVD) and so on.

In some embodiments, the first isolation structures 111 in the memory array region and the shallow trench isolation structures in the periphery region may be formed simultaneously. The shallow trench isolation structures in the periphery region may be of an oxide-nitride-oxide (ONO) structure. In some embodiments, forming the first trenches 110 by etching may also include operations such as etch ashing, etch cleaning and the like. Forming the first isolation structures 111 by filling may also include operations such as performing chemical mechanical polishing (CMP) on the surface of substrate 100, removing excess oxide strips and nitride strips on the surface of substrate 100 and so on.

S30 is performed. As shown in FIGS. 4A to 4D, multiple mutually parallel second trenches 120 extending in the X direction may be formed in the substrate 100 and the first isolation structures 111 by a process such as photolithography, etching or the like. It is to be understood that, bottom surfaces of the second trenches 120 at the substrate 100 may be lower than the bottom surfaces of the second trenches 120 at the first isolation structures 111, so as to facilitate a subsequent formation of second isolation structures. The second trenches 120 and the first trenches 110 divide the substrate 100 into multiple active pillars 130, Each active pillar may be used to form a channel structure, a drain and a source in a selection transistor of a memory. It is to be understood that, a length direction of the active pillars 130 is the Z direction. That is, the selection transistors are arranged perpendicular to the surface of substrate 100, which is beneficial to reduce occupied area of the semiconductor structure in a horizontal direction. A depth of the second trenches 120 in the Z direction is smaller than a depth of the first trenches 110 in the Z direction, such that the depth of the bit line structures subsequently formed in the second trenches 120 is smaller, and the isolation effect of the first isolation structures 111 is better, so as to reduce a bottom leakage phenomenon.

S40 is performed. As shown in FIGS. 7A to 7D, the second isolation structures 121, which alternately arranged with the first isolation structures 111 along the X direction may be formed in the second trenches 120 by a process such as deposition or the like. For example, there are multiple second isolation structures 121 in one second trench 120. Each of the second isolation structures 121 is located between two adjacent active pillars 130 in the Y direction. In the X direction, every two adjacent ones of the second isolation structures 121 are separated by one first isolation structure 111. Top surfaces of the second isolation structures 121 may be lower than bottom surfaces of the second trenches 120 at the first isolation structures 111. In this way, the second isolation structures 121 can further reduce the depth of the bit line structures formed subsequently in the Z direction and provide a better isolation effect for bottom surfaces of the bit line structures, so as to reduce the bottom leakage phenomenon.

S50 is performed. As shown in FIGS. 9a to 9d, the bit line structures 140 may be formed above the second isolation structures 121 by a process such as etching, deposition, metal silicide processing or the like. The bit line structures 140 extend in the Y direction and penetrate the multiple active pillars 130 in the Y direction. For example, the width of part of each of the second trenches 120 above the second isolation structures 121 is enlarged by such as etching or the like. That is, the width of the active pillars 130 may be reduced. The bit line structures 140, each penetrating multiple of the active pillars 130 in the Y direction, are formed above the second isolation structures 121 by a metal silicide process and a deposition process. Each bit line structure 140 may include conductive material portions deposited above the second isolation structures 121 and metal silicide portions formed in the active pillars 130. In this way, the bit line structure 140 is located above the second isolation structures 121, so the depth of the bit line structure 140 is smaller, and since the depth of the first isolation structures 111 is larger, a better isolation effect can be provided between two adjacent ones of the bit line structures 140, so as to reduce the bottom leakage phenomenon. In some embodiments, at the edge of the memory array, the leakage phenomenon is not easy to occur between the bit line structures 140 with the smaller depth and the periphery, so the reliability of the device is better. It can be understood that, the first isolation structures 111 and the second isolation structures 121 enable the bit line structures 140 to obtain better isolation effects in both X and Y directions.

S60 is performed. As shown in FIGS. 12A to 12D, multiple mutually parallel word line structures 150 may be formed above the bit line structures 140 by etching, deposition or the like. The word line structures 150 extend in the X direction and each of the word line structures 150 may surround multiple of the active pillars 130 in its extending direction. That is, GAAs are formed. The word line structure 150 herein may include a gate oxide layer wrapping each of the active pillars 130, and a word line surrounding the gate oxide layers. A material of the word lines herein includes, but is not limited to, a conductive material such as copper (Cu), tungsten (W), titanium nitride (TiN), or the like. As such, the word line structures 150 have a strong ability to control the channels of the selection transistors, so as to improve electrical performance of the semiconductor structure. It can be understood that, in the Z direction, isolation structures are provided between the bit line structures 140 and the word line structures 150, so as to avoid a leakage phenomenon between the bit line structures 140 and the word line structures 150.

In some embodiments, as shown in FIGS. 4A to 4D, forming multiple mutually parallel second trenches 120 extending in a second direction in the substrate 100 and in the first isolation structures 111 includes the following operation. The second trenches 120 are such formed that the second trenches are formed are formed in the substrate 100 and the first isolation structures 111 extending in the second direction and have first portions 122 and second portions 123 alternately arranged in the second direction. A depth of the first portions 122 is greater than a depth of the second portions 123. The depth of the first portions 122 is less than the depth of the first isolation structures 111. The first portions 122 are portions of the second trenches 120 located in the substrate 100. The second portions 123 are portions of the second trenches 120 located in the first isolation structures 111.

In the embodiments of the disclosure, the second trenches 120 having alternately arranged first portions 122 and second portions 123 in the X direction may be formed by selective etching, stepwise etching, etc. The first portions 122 may be formed by etching away part of the substrate 100, the second portions 123 may be formed by etching away part of the first isolation structures 111. The depth of the first portions 122 is greater than the depth of the second portions 123 in the Z direction. It is can understood that, the remaining part of the substrate 100 located between two adjacent first isolation structures 111 in the X direction and located between the first portions 122 of two adjacent second trenches 120 in the Y direction is an active pillar 130. In this way, the first portions 122 having a larger depth may be used to form the second isolation structures, such that the tops of the bit line structures formed above the second isolation structures are not higher than the bottoms of the second portions 123. Therefore, the isolation effect of the first isolation structures 111 on the bit line structures is better.

In some embodiments, as shown in FIGS. 5A to 7D, forming second isolation structures 121 alternately arranged with the first isolation structures 111 along the second direction at bottoms of the second trenches 120 includes the following operation. The second isolation structures 121 are formed in the first portions 122. The top surfaces of the second isolation structures 121 are lower than the bottom surfaces of the second portions 123. The second isolation structures 121 and the first isolation structures 111 are alternately arranged in the second direction.

In an embodiment of the disclosure, the second isolation structures 121 may be formed in the first portions 122, such that the second isolation structures 121 are alternately arranged with the first isolation structures 111 in the X direction. The top surfaces of the second isolation structures 121 are lower than the bottom surfaces of the second portions 123, such that the tops of the bit line structures subsequently formed above the second isolation structures 121 are not higher than the bottom surfaces of the second portions 123. It is can understood that the bottom surfaces of the second portions 123 refer to the bottom surfaces of the second trenches 120 in the first isolation structures 111.

Figure 15:
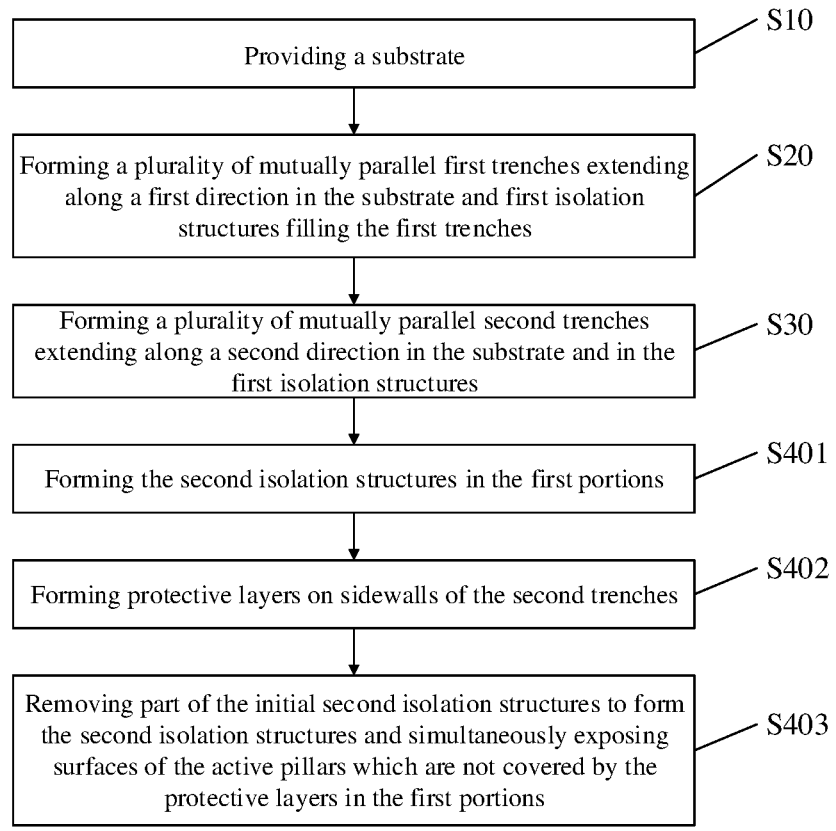
FIG. 15 is a flowchart of processes for forming second isolation structures in a semiconductor structure provided by an embodiment of the disclosure.

Specifically, as shown in FIG. 15, forming the second isolation structures 121 includes the following operations.

In S401, initial second isolation structures 124 are formed in the first portions 122. Top surfaces of the initial second isolation structures 124 are flush with the bottom surfaces of the second portions 123.

In S402, protective layers 125 are formed on sidewalls of the second trenches 120 after forming the initial second isolation structures 124.

In S403, removing part of each of the initial second isolation structures 124 to form each of the second isolation structures 121 and simultaneously expose surfaces of the active pillars 122 that are not covered by the protective layers 125 in the first portions 130.

By performing S401, as shown in FIGS. 5A to 5D, the initial second isolation structure 124 may be formed in the first portions 122 by a process such as deposition, back-etching or the like. For example, a first trench 120 is filled with a second isolation material by a deposition process, such that the second isolation material is filled to be higher than the bottom surface of the second portion 123. The second isolation material herein may include, but is not limited to, silicon oxide, spin-coated insulating medium, silicon nitride, silicon oxynitride, or the like. Part of the second isolation material is then removed by back-etching to form the initial second isolation structure 124 and make the top surface of the initial second isolation structure 124 flush with the bottom surface of the second portion 123. In some embodiments, depending on requirements of an actual process, the top surface of the initial second isolation structure 124 may also be lower than the bottom surface of the second portion 123.

S402 is performed. As shown in FIGS. 6A to 6D, the protective layers 125 may be formed on sidewalls of the second trenches 120 by a process such as deposition, etching or the like. A thickness of the protective layers 125 may be controlled between 3-20 nm. For Example, a protective material may be firstly filled in a second trench 120 in which the initial second isolation structure 124 is provided by a deposition process, until the protective material fills the entire second trench 120 and covers the surface of the substrate 100. The protective material includes, but not limited to, silicon oxide, silicon nitride, etc. It is worth noting that the protective material here may be different from the second isolation material, so as to facilitate a subsequent selective etching to form the second isolation structures. Part of the protective material located in the central of the second trench 120 is removed by an etching process, and thus the protective material on the sidewalls of the second trench 120 and the protective material located on the top surfaces of the active pillars 130 are retained. Therefore, the protective layers 125 covering the active pillars 130 are formed. The protective layers 125 may be used to protect the active pillars 130 in subsequent processes, and may be used as sacrificial layers during the formation of the word line structures, thereby forming GAA structures surrounding the active pillars 130. In other embodiments, the protective layers 125 may be formed on the sidewalls of the second trenches 120 by a thermal oxidation process according to requirements of an actual process.

S403 is performed. As shown in FIGS. 7A to 7D, part of each initial second isolation structure 124 may be removed by a process such as etching or the like, to form a second isolation structure 121. For example, a preset height of an initial second isolation structure 124 may be removed by selective etching without destroying the protective layers 125, and the remaining part is the second isolation structure 121. It can be understood that, the preset height may be the thickness of a subsequent formed bit line structure in the Z direction, thereby ensuring an isolation effect of the first isolation structures 111 on the bit line structures.

In some embodiments, the structure at the edge of the memory array may be identical to the structure shown in FIG. 7D. Since the second isolation structures 121 are provided at the bottoms of the second trenches 120, and the bit line structures will be formed above the second isolation structures 121, the 100 substrate below the second trenches 120 is not prone to be over-etched while forming the bit line structures, thereby reducing possibility of leakage between the bit line structures and the periphery.

In some embodiments, as shown in FIGS. 8A to 9D, forming multiple mutually parallel bit line structures 140 extending in the first direction above the second isolation structures 121 includes the following operations. Part of the surfaces of the active pillars 130 not covered by the protective layers 125 are lateral-etched to form recesses 131 above the second isolation structures 121. A width of each recess 131 is larger than a width of each first portion 122 in the first direction. The bit line structures 140, each of which penetrates multiple of the active pillars 130 in the first direction, are formed at the recesses 131.

In an embodiment of the disclosure, as shown in FIGS. 8a to 8d, part of the sidewalls of the active pillars 130 not covered by the protective layers 125 may be lateral-etched by a process such as etching or the like, to form the recesses 131 above the second isolation structures 121. As shown in FIG. 8a, along the Y direction, a width w1 of the recesses 131 is larger than a width w2 of the first portions 122, so as to facilitate filling a conductive material subsequently to form the bit line structures penetrating the active pillars 130. In some embodiments, as shown in FIG. 8A, the recesses 131 may have a bowl-shaped structure, a Σ shaped structure or the like. The active pillar 130 may be etched to be disconnected, or a portion connected with the substrate 100 may be retained.

In some embodiments, the active pillars 130 are etched that they are disconnected with the substrate 100, and sharp corners at lower ends of the active pillars 130 are etched away, thereby reducing the problem of charge accumulation at tips. For example, surfaces of the lower ends of the active pillars 130 may be in a shape of a plane, a circular arc, etc.

In some embodiments, as shown in FIGS. 9A to 9D, forming the bit line structures 140, each of which penetrates multiple of the active pillars 130 in the first direction, at the recesses 131, includes the following operations. A metal silicide process is performed on sidewalls of the recesses 131 to convert part of the active pillars 130 between adjacent recesses 131 and at a same horizontal position as the recesses 131 into metal silicide. A conductive material is filled in the recesses 131. The conductive material and the metal silicide together form the bit line structures 140 which are conducting along the first direction, and top surfaces of the bit line structures 140 are flush with the bottom surfaces of the second portions 123.

In an embodiment of the disclosure, part of the active pillars 130 located between two adjacent recesses 131 in the Y direction may be converted into metal silicide by the metal silicide process, so as to reduce a contact resistance between the active pillars 130 and the bit line structures 140. The recesses 131 are then filled with the conductive material by a process such as deposition or the like. The conductive material is in contact with the metal silicide, thereby forming the bit line structures 140 conducting along the Y direction. It can be understood that, each of the bit line structures 140 connects multiple of the active pillars 130 along the Y direction. That is, one bit line structure 140 can perform operations such as writing and reading data to multiple memory nodes through multiple selection transistors. Top surfaces of the bit line structures 140 formed herein may be flush with the bottom surfaces of the second portions 123, or may be lower than the bottom surfaces of the second portions 123, such that the isolation effect of two adjacent bit line structures 140 isolated by the first isolation structure 111 is better. It can be understood that, the bottom surfaces of second portions 123 refer to the bottom surfaces of the second trenches 120 in the first isolation structures 111.

In some embodiments, a source or drain connecting each of the bit line structures 140 may be formed in each of the active pillars 130 above the bit line structures 140 by diffusion, ion implantation or other processes.

Figure 16:
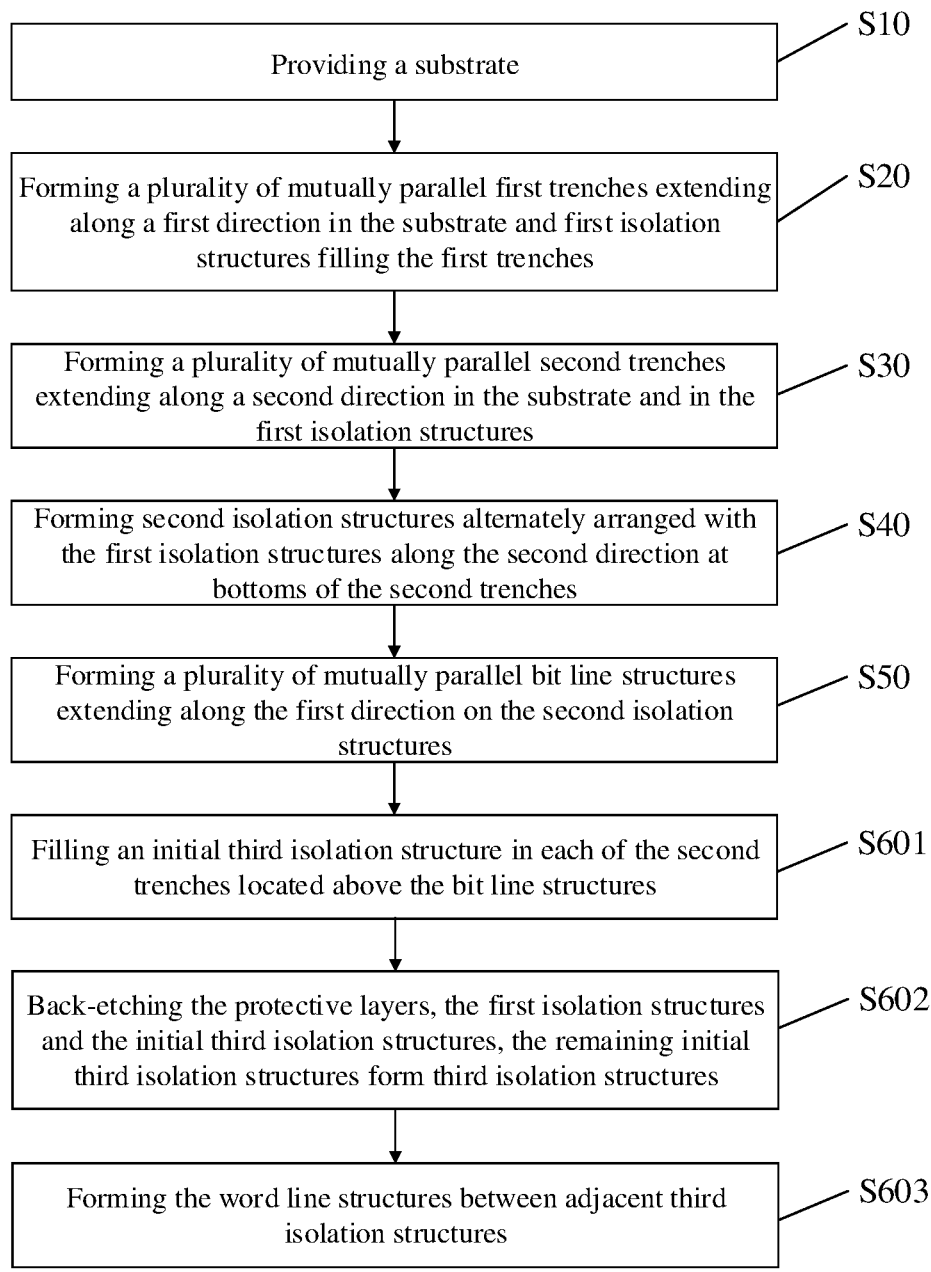
FIG. 16 is a flowchart of processes for forming word line structures in a semiconductor structure provided by an embodiment of the disclosure.

In some embodiments, as shown in FIG. 16, forming multiple mutually parallel word line structures 150 extending along the second direction above the bit line structures 140 includes the following operations, and the corresponding structural schematic diagrams are shown in FIGS. 10A to 12D.

In S601, an initial third isolation structure is filled in each of the second trenches located above the bit line structures.

In S602, each of the protective layers 125, each of the first isolation structures 111 and each of the initial third isolation structures 126 are back-etched, so as to expose a channel region 132 and a top active area 133 of each of the active pillars 130. The remaining protective layers 125 and the first isolation structures 111 cover bottom active areas 134 of the active pillars 130. The remaining initial third isolation structures 126 form the third isolation structures 127. Top surfaces of the third isolation structures 127 are at least higher than upper ends of the channel regions 132.

In S603, the word line structures 150 are formed between the adjacent third isolation structures 127. The word line structures 150 wrap channel regions 132, and top surfaces of the word line structures 150 are not higher than the top surfaces of the third isolation structures 127.

S601 is performed. As shown in FIGS. 10A to 10D, a third isolation material may be filled in the second trenches 120 above the bit line structures 140 by a deposition process, until the third isolation material fills up the second trenches 120, thereby forming the initial third isolation structures 126. The third isolation material herein includes, but is not limited to, silicon oxide, spin-coated insulating medium, silicon nitride, silicon oxynitride, etc. It should be noted that the third isolation material may be different from the protective material in the above embodiments, so as to facilitate a subsequent selective etching to expose the channel regions and the top active areas of the active pillars 130. In some embodiments, the surface of the substrate 100 may also be planarized after the third isolation material is filled.

S602 is performed. As shown in FIGS. 11A to 11D, from the surface of the substrate 100, part of the protective layers 125, part of the first isolation structures 111 and part of the initial third isolation structures 126 are removed by a process such as back etching, thereby exposing top active areas 133 and channel regions 132 of the active pillars 130. The top active area 133 may be used to form a source or a drain of a selection transistor. The channel region 132 is wrapped by a word line structure formed in a subsequent process to form a GAA structure. For example, since the materials of the protective layers 125 and the first isolation structures 111 may be the same, the protective layers 125 and the first isolation structures 111 with the same height may be removed by such as selective etching, step-by-step etching or the like, so as to form word line trenches for filling word line structures. The word line trenches extend in the X direction and expose the top active areas 133 and the channel regions 132 of the active pillars 130. The remaining protective layers 125 cover bottom active areas 134 of the active pillars 130. It should be noted that by the selective etching and step-by-step etching, part of the initial third isolation structures 126 may be consumed, to form the third isolation structures 127. Top surfaces of the third isolation structures 127 are at least higher than upper ends of the channel regions 132, such that the top surfaces of the third isolation structures 127 are at least higher than the top surfaces of the subsequently formed word line structures, and thus the isolation effect is better. It is to be understood that, in the some embodiments, the initial third isolation structures 126 may also not be consumed, so as to directly serve as the third isolation structures 127.

It can be understood that, compared with the embodiments shown in FIGS. 1A to 1C, in the embodiments of the disclosure, by increasing the depth of the second trenches 120, morphologies of the active pillars 130 can be effectively improved. By increasing the width of the second trenches 120 above the bit line structures 140, the formed third isolation structures 127 having an inverted cone shape are thicker, and the third isolation structures 127 are less prone to skew, collapse or the like after part of the protective layers 125 are removed, thus improving the reliability of the semiconductor structure. It is to be noted that, for convenience of illustration, the initial third isolation structures 126 and the third isolation structures 127 in the drawings are not shown in an inverted cone shape.

S603 is performed. As shown in FIGS. 12A to 12D, a word line structure 150 may be formed between two adjacent ones of the third isolation structures 127 by a process such as deposition, etching or the like. The word line structures 150 extend in the X direction and surround the channel regions 132 of the multiple active pillars 130. For example, firstly, a gate oxide layer at least wrapping the channel regions 132 is formed by a process such as deposition or thermal oxidation. A conductive material is then filled between two adjacent ones of the third isolation structures 127 by a process such as deposition to form the word line. A gate oxide layer and a word line together constitute a word line structure 150. The conductive material includes, but not limited to, copper, tungsten, titanium nitride, or the like. In some embodiments, the conductive material may be filled between adjacent third isolation structures 127 until the conductive material covers the top surfaces of the third isolation structures 127. Then part of the conductive material may be removed by a process such as back-etching or the like, such that the top surfaces of the finally formed word line structures 150 are not higher than the top surfaces of the third isolation structures 127.

In some embodiments, a drain or a source of a selection transistor may also be formed in the top active area 133 of each of the active pillars 130 by a process such as diffusion, ion implantation or the like.

In some embodiments, as shown in FIGS. 13A through 13D, the method further includes the following operations. A fourth isolation structure 128 is filled above the word line structures 150 and the third isolation structures 127, until the fourth isolation structure 128 covers the top active areas 133. The surface of the substrate 100 is planarized.

In an embodiment of the disclosure, a fourth isolation material may be filled above the word line structures 150 and the third isolation structures 127 by a process such as deposition, until the fourth isolation material covers the top active areas 133 to form the fourth isolation structure 128. The fourth isolation material includes, but is not limited to, silicon oxide, spin-coated insulating medium, silicon nitride, silicon oxynitride, or the like. It can be understood that, the fourth isolation material here may be the same as the third isolation material, or they may be different. After filling the fourth isolation material, the surface of the substrate 100 may also be planarized by chemical mechanical polishing, so as to facilitate a subsequent formation of storage nodes and other structures on the surface of substrate 100.

With reference to FIGS. 13A to 13D, a semiconductor structure provided by an embodiment of the disclosure is described below. The semiconductor structure includes: a substrate 100; multiple mutually parallel first trenches 110 located in the substrate 100 and extending in a first direction, and first isolation structures 111 located in the first trenches 110, in which the first direction is parallel to the surface of the substrate 100; multiple mutually parallel second trenches 120 located in the substrate 100 and extending in a second direction, in which the first trenches 110 and the second trenches 120 divide the substrate 100 into multiple active pillars 130, the second direction is parallel to the surface of the substrate 100 and perpendicular to the first direction, and a depth of the second trenches 120 is less than a depth of the first trenches 110; second isolation structures 121 located at bottoms of the second trenches 120 and arranged alternately with the first isolation structures 111 along the second direction, in which top surfaces of the second isolation structures 121 are lower than bottom surfaces of the second trenches 120 in the first isolation structures 111; multiple mutually parallel bit line structures 140 located above the second isolation structures 121 and extending in the first direction, in which each of the bit line structures 140 penetrates multiple of the active pillars 130 along the first direction; multiple mutually parallel word line structures 150 located above the bit line structures 140 and extending in the second direction.

In an embodiment of the disclosure, the second isolation structures 121 are located at bottoms of the second trenches 120, and the bit line structures 140 are located above the second isolation structures 121. Since the depth of the second trenches 120 in the Z direction is less than the depth of the first trenches 110, and the top surfaces of the second isolation structures 121 are lower than the bottom surfaces of the second trenches 120 in the first isolation structures 111, the depth of the bit line structures 140 in the Z direction is smaller. Therefore, the isolation effect of the first isolation structure 111 between two adjacent bit line structures 140 is better, so as to reduce the bottom leakage phenomenon of the bit line structures 140. In addition, in some embodiments, at the edge of the memory array, the leakage phenomenon is not easy to occur between the bit line structures 140 having the smaller depth and the periphery, so the reliability of the device is better. It can be understood that, the first isolation structures 111 and the second isolation structures 121 allow the bit line structures 140 having better isolation effects in both X and Y directions.

In some embodiments, each of the second trenches 120 has alternately arranged first portions 122 and second portions 123 along the second direction. A depth of the first portions 122 is greater than a depth of the second portions 123. The depth of the first portions 122 is less than the depth of the first isolation structures 111. The first portions 122 are portions of the second trenches 120 located in the substrate 100. The second portions 123 are portions of the second trenches 120 located in the first isolation structures 111.

In some embodiments, the second isolation structures are located in the first portions. The top surfaces of the second isolation structures are lower than the bottom surfaces of the second portions.

In an embodiment of the disclosure, the depth of the second portions 123 is smaller than that of the first portions 122 in the Z direction, and the second isolation structures 121 are located in the first portions 122 which are deeper. Therefore, tops of the bit line structures above the second isolation structures 121 are not higher than the bottoms of the second portions 123, and the isolation effect of the first isolation structures 111 between two adjacent bit line structures is better. In addition, the second isolation structures 121 can provide a better isolation effect for bottom surfaces of the bit line structures, so as to reduce the bottom leakage phenomenon.

In some embodiments, the semiconductor structure also includes protective layers 125, which cover the part of sidewalls of the second trenches 120 above the second isolation structures 121. Lower ends of the protective layers 125 are flush with the bottoms of the second portions 123.

In an embodiment of the disclosure, the lower ends of the protective layers 125 are flush with the bottom surfaces of the second portions 123, such that the protective layer 125 can be used to separate the bit line structures 140 from the word line structures 150 located above the protective layers 125.

In some embodiments, recesses 131 are located at surfaces of the active pillars 130 which are located above the second isolation structures 121 and are not covered by the protective layers 125. Along the first direction, a width of the recesses 131 is greater than a width of the first portions 122. The bit line structures 140 are locate at the recesses 131, each of which penetrates multiple of the active pillars 130 in the first direction.

In an embodiment of the disclosure, along the Y direction, a width of the recesses 131 is larger than a width of the first portions 122. The recesses 131 may be of a bowl-shaped structure, a Σ shaped structure, or the like, in order that the bit line structures 140 connect the active pillars 130. In addition, surfaces of the lower ends of the active pillars 130 located at the recesses 131 may have a shape of a plane, a circular arc, or the like, thereby reducing a problem of charge accumulation at tips if the lower ends of the active pillars 130 are sharp.

In some embodiments, each of the bit line structures 140 includes a metal silicide structure 141 and a conductive structure 142. The metal silicide structure 141 is located in each of the active pillars 130 between two adjacent recesses 131 and at a same horizontal position as the recesses 131. The conductive structure 142 is located in the recesses 131. The conductive structures 142 are connected with the metal silicide structures 141 located in a same line extending in the first direction. The top surfaces of the bit line structures 140 are flush with the bottom surfaces of the second portions 123.

In an embodiment of the disclosure, the active pillars 130 are in contact with the conductive structures 142 through the metal silicide structures 141, such that the contact resistance of the bit line structures 140 can be reduced. Top surfaces of the bit line structures 140 may be flush with the bottom surfaces of the second portions 123, or may be lower than the bottom surfaces of the second portions 123, such that the isolation effect of the first isolation structures 111 on two adjacent bit line structures 140 is better. It can be understood that, the bottom surfaces of second portions 123 refer to the bottom surfaces of the second trenches 120 in the first isolation structures 111.

In some embodiments, each of the active pillars 130 includes a top active area 133, a channel region 132 and a bottom active area 134 distributed from top to bottom sequentially. The semiconductor structure further includes third isolation structures 127 located in the second trenches 120 above the bit line structures 140. The protective layers 125 and the first isolation structures 111 cover the bottom active areas 134. Top surfaces of the third isolation structures 127 are at least higher than upper ends of the channel regions 132. Each of the word line structures 150 are located between two adjacent ones of the third isolation structures 127. The word line structure 150 wraps the channel regions 132, and the top surface of the word line structure 150 is not higher than the top surface of the third isolation structures 127.

In an embodiment of the disclosure, the top active area 133 and the bottom active area 134 are used as a source and a drain of the vertical selection transistor, respectively. Each of the word line structures 150 may include a gate oxide layer covering the channel regions 132 and a word line surrounding the gate oxide layer, so as to constitute a GAA structure, thereby improving the ability of the word line structures 150 to control channels of the selection transistors. The third isolation structures 127 are used for isolating the adjacent word line structures 150. Top surfaces of the word line structures 150 are not higher than top surfaces of the third isolation structures 127, so as to ensure the isolation effect. It can be understood that, the protective layers 125 and the first isolation structures 111 cover the bottom active areas 134 to prevent current leakage between the bottom active areas 134 and the word lines. In addition, the protective layers 125 and the first isolation structures 111 may also be used to isolate the word line structures 150 from the bit line structures 140.

In some embodiments, by increasing the depth of the second trenches 120, morphologies of the active pillars 130 can be effectively improved. By increasing the width of the second trenches 120 above the bit line structures 140, the third isolation structures 127 having an inverted cone shape are thicker, and the third isolation structures 127 are less prone to skew, collapse and the like during the process of forming the word line structure 150, which improving the reliability of the semiconductor structure.

In some embodiments, the semiconductor structure further includes a fourth isolation structure 128 located above the third isolation structures 127 and the word line structures 150. The fourth isolation structure 128 covers the top active areas 133.

In an embodiment of the disclosure, the fourth isolation structure 128 is used to prevent current leakage between the word line structures 150 and other devices above the word line structures. In addition, the fourth isolation structure 128 may be used to isolate the top active areas 133 from the word lines.

In some embodiments, compared with the embodiment shown in FIGS. 1A to 1C, the depth of the second trenches 120 may be increased by ⅓ to ⅔ in FIGS. 3A to 13D, and in the Z direction, the depth of the positions where the bit line structures 140 locate is ⅔ to ¾ of the depth of the second trenches 120, while the depth of the positions where the word line structures 150 locate is half of the depth of the positions where the bit line structures 140 locate. It can be understood that, the depth of the second trenches 120 refers to the depth of the first portions 122. Therefore, the bit line structures 140 can be isolated in the X direction by the second isolation structures, the third isolation structures and the protective layers, and the bit line structures 140 can be isolated in the Y direction by the first isolation structures, thereby effectively reducing the leakage phenomenon between two adjacent bit line structures 140. In addition, since the depth of the bit line structures 140 is smaller, the leakage phenomenon is not easy to occur between the periphery and the bit line structures 140 which have the smaller depth. On the other hand, by increasing the depth of the second trenches 120, morphologies of the active pillars 130 can be effectively improved and the width of the second trenches 120 at the word line structures 150 can be increased, such that the third isolation structures having an inverted cone shape are thicker, and after removing the protective layers, the third isolation structures 127 are less prone to skew, collapse and the like, thereby improving the reliability of the semiconductor structure.

Figure 17:
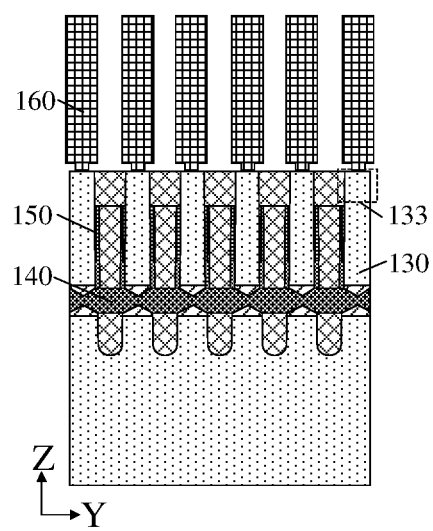
FIG. 17 is a structural schematic diagram of a memory provided by an embodiment of the disclosure.

As shown in FIG. 17, the embodiments of the disclosure provide a memory, including a semiconductor structure of any of the foregoing embodiments and storage nodes 160 located on a surface of the substrate 100. Each of the storage nodes is connected to the top active area 133 of each of the active pillars 130.

In an embodiment of the disclosure, different storage states of the storage nodes 160 are used to represent different data information. By applying different voltages to the word line structures 150 and the bit line structures 140 in the semiconductor structure, the storage states of the storage nodes 160 may be changed or acquired to realize operations such as writing or reading. Each of the storage nodes 160 includes, but is not limited to, a storage capacitor (MTJ), a magnetic tunnel junction (MTJ), a GST ($Ge_xSb_yTe_z$) Unit, etc. It can be understood that, since the bit line structures are formed above the second isolation structures, on one hand, a height difference between the bottoms of the bit line structures and the bottoms of the first isolation structures is larger, and the leakage phenomenon is not easy to occur between two adjacent bit lines; on the other hand, the bit line structures with the smaller depth are not easy to cause leakage between the edge of the memory array and the peripheral circuits, which improves the reliability of the memory.

It should be noted that, the features of the method or the device disclosed in the several embodiments provided in this disclosure can be arbitrarily combined without conflict, to obtain a new method embodiment or a new device embodiment.

The above-mentioned is only specific embodiments of the disclosure, but the scope of protection of the disclosure is not limited thereto. Any skilled person familiar with the technical field can easily think of changes or substitutions within the technical scope of the disclosure, and should be covered within the scope of protection of the disclosure. Therefore, the scope of protection of this disclosure shall be subject to the scope of protection of the claims.

What is claimed is:

1. A method for manufacturing a semiconductor structure, comprising:
    providing a substrate;
    forming a plurality of mutually parallel first trenches extending along a first direction in the substrate and first isolation structures filling the first trenches, wherein the first direction is parallel to a surface of the substrate;
    forming a plurality of mutually parallel second trenches extending along a second direction in the substrate and in the first isolation structures, wherein the first trenches and the second trenches divide the substrate to form a plurality of active pillars, the second direction is parallel to the surface of the substrate and perpendicular to the first direction, and a depth of the second trenches is less than a depth of the first trenches;
    forming second isolation structures alternately arranged with the first isolation structures along the second direction at bottoms of the second trenches, wherein top surfaces of the second isolation structures are lower than bottom surfaces of the second trenches located in the first isolation structures;
    forming a plurality of mutually parallel bit line structures extending along the first direction on the second isolation structures, wherein each of the bit line structures penetrates a plurality of active pillars along the first direction; and
    forming a plurality of mutually parallel word line structures extending along the second direction above the bit line structures.

2. The method of claim 1, wherein forming a plurality of mutually parallel second trenches extending along a second direction in the substrate and in the first isolation structures comprises:
    forming the second trenches, such that the second trenches are formed in the substrate and in the first isolation structures extending along the second direction and have alternately arranged first portions and second portions along the second direction, wherein a depth of the first portions is greater than a depth of the second portions, and the depth of the first portions is less than a depth of the first isolation structures;
    wherein the first portions are portions of the second trenches located in the substrate, the second portions are portions of the second trenches located in the first isolation structures.

3. The method of claim 2, wherein forming second isolation structures alternately arranged with the first isolation structures along the second direction at bottoms of the second trenches comprises:
    forming the second isolation structures in the first portions, wherein top surfaces of the second isolation structures are lower than bottom surfaces of the second portions, and the second isolation structures and the first isolation structures are alternately arranged along the second direction.

4. The method of claim 3, wherein forming the second isolation structures in the first portions comprises:
    forming initial second isolation structures in the first portions, wherein top surfaces of the initial second isolation structures are flush with the bottom surfaces of the second portions; and removing part of each of the initial second isolation structures to form each of the second isolation structures.

5. The method of claim 4, further comprising:
forming protective layers on sidewalls of the second trenches after forming the initial second isolation structures; and when removing part of each of the initial second isolation structures to form each of the second isolation structures, simultaneously exposing surfaces of the active pillars which are not covered by the protective layers in the first portions.

6. The method of claim 5, wherein forming a plurality of mutually parallel bit line structures extending along the first direction above the second isolation structures comprises:
lateral-etching the surfaces of the active pillars which are not covered by the protective layers to form recesses above the second isolation structures, wherein along the first direction, a width of the recesses is larger than a width of the first portions; and
forming bit line structures, each penetrating the plurality of active pillars along the first direction, at the recesses.

7. The method of claim 6, wherein forming bit line structures, each penetrating a plurality of active pillars along the first direction, at the recesses comprises:
performing a metal silicide process on sidewalls of the recesses to convert a part of each of the active pillars between two adjacent ones of the recesses and at a same horizontal position as the recesses into metal silicide; and
filling a conductive material in the recesses, wherein the conductive material and the metal silicide together form the bit line structures which are conducting along the first direction, and top surfaces of the bit line structures are flush with the bottom surfaces of the second portions.

8. The method of claim 5, wherein forming a plurality of mutually parallel word line structures extending along the second direction above the bit line structures comprises:
filling an initial third isolation structure in each of the second trenches located above the bit line structures;
back-etching the protective layers, the first isolation structures and the initial third isolation structures, to expose a channel region and a top active area of each of the active pillars, wherein the remaining protective layers and the first isolation structures cover bottom active areas of the active pillars, the remaining initial third isolation structures form third isolation structures, and top surfaces of the third isolation structures are at least higher than upper ends of the channel regions; and
forming the word line structures between adjacent third isolation structures, wherein the word line structures wrap the channel regions, and top surfaces of the word line structures are not higher than the top surfaces of the third isolation structures.

9. The method of claim 8, further comprising:
filling a fourth isolation structure above the word line structures and the third isolation structures until the fourth isolation structure covers the top active areas; and
planarizing the surface of the substrate.

10. A semiconductor structure, comprising:
a substrate;
a plurality of mutually parallel first trenches located in the substrate and extending along a first direction and first isolation structures located in the first trenches, wherein the first direction is parallel to a surface of the substrate;
a plurality of mutually parallel second trenches extending along a second direction located in the substrate, wherein the first trenches and the second trenches divide the substrate into a plurality of active pillars, the second direction is parallel to the surface of the substrate and perpendicular to the first direction, and a depth of the second trenches is less than a depth of the first trenches;
second isolation structures located at bottoms of the second trenches and alternately arranged with the first isolation structures along the second direction, wherein top surfaces of the second isolation structures are lower than bottom surfaces of the second trenches located in the first isolation structures;
a plurality of mutually parallel bit line structures located above the second isolation structures and extending along the first direction, wherein each of the bit line structures penetrates the plurality of active pillars along the first direction; and
a plurality of mutually parallel word line structures located above the bit line structures and extending along the second direction.

11. The semiconductor structure of claim 10, wherein each of the second trenches has alternately arranged first portions and second portions along the second direction, a depth of the first portions is greater than a depth of the second portions, and the depth of the first portions is less than a depth of the first isolation structures;
wherein the first portions are portions of the second trenches located in the substrate, the second portions are portions of the second trenches located in the first isolation structures.

12. The semiconductor structure of claim 11, wherein the second isolation structures are located in the first portions, top surfaces of the second isolation structures are lower than bottom surfaces of the second portions.

13. The semiconductor structure of claim 12, further comprising:
protective layers covering sidewalls of the second trenches above the second isolation structures, wherein lower ends of the protective layers are flush with the bottom surfaces of the second portions.

14. The semiconductor structure of claim 13, wherein recesses are located at surfaces of the active pillars which are located above the second isolation structures and are not covered by the protective layers, and along the first direction, a width of the recesses is greater than a width of the first portions; and
the bit line structures are located at the recesses, penetrating the plurality of active pillars along the first direction.

15. The semiconductor structure of claim 14, wherein each of the bit line structures comprises:
a metal silicide structure, located in the active pillar between two adjacent ones of the recesses and at a same horizontal position as the recesses; and
a conductive structure, located in each of the recesses, wherein the conductive structures are connected with the metal silicide structures located on a same straight line extending along the first direction, and top surfaces of the bit line structures are flush with the bottom surfaces of the second portions.

16. The semiconductor structure of claim 13, wherein each of the active pillars comprises a top active area, a channel region and a bottom active area distributed from top to bottom sequentially; and
the semiconductor structure further comprises:

third isolation structures, each located in each of the second trenches above the bit line structures, wherein the protective layers and the first isolation structures cover the bottom active areas, and top surfaces of the third isolation structures are at least higher than upper ends of the channel regions, wherein each of the word line structures is located between two adjacent ones of the third isolation structures, the word line structure wraps the channel regions, and a top surface of the word line structure is not higher than the top surfaces of the third isolation structures.

17. The semiconductor structure of claim 16, further comprising:

a fourth isolation structure located above the third isolation structures and the word line structures, wherein the fourth isolation structure covers tops of the active areas.

18. A memory, comprising:

a semiconductor structure of claim 10; and storage nodes, located on the surface of the substrate and each connected to the top active area of each of the active pillars.

* * * * *